US010222610B2

(12) United States Patent
Mizoguchi

(10) Patent No.: US 10,222,610 B2
(45) Date of Patent: Mar. 5, 2019

(54) OPTICAL SCANNER, IMAGE DISPLAY DEVICE, AND HEAD MOUNTED DISPLAY

(71) Applicant: Seiko Epson Corporation, Tokyo (JP)

(72) Inventor: Yasushi Mizoguchi, Suwa (JP)

(73) Assignee: Seiko Epson Corporation (JP)

( * ) Notice: Subject to any disclaimer, the term of this patent is extended or adjusted under 35 U.S.C. 154(b) by 261 days.

(21) Appl. No.: 14/668,286

(22) Filed: Mar. 25, 2015

(65) Prior Publication Data
US 2015/0277109 A1 Oct. 1, 2015

(30) Foreign Application Priority Data

Mar. 25, 2014 (JP) ................................ 2014-062779

(51) Int. Cl.
*G02B 26/10* (2006.01)
*B81B 3/00* (2006.01)
(Continued)

(52) U.S. Cl.
CPC .......... *G02B 26/105* (2013.01); *B81B 3/0051* (2013.01); *G02B 26/085* (2013.01); *G02B 27/0176* (2013.01); *H04N 5/23293* (2013.01); *B81B 2201/042* (2013.01); *B81B 2203/058* (2013.01)

(58) Field of Classification Search
CPC .............. G02B 26/0833; G02B 26/085; G02B 26/0858; G02B 7/1821; G02B 26/0841; G02B 26/10; B81B 3/0051; B81B 2201/042; B81B 3/001; B81B 2203/0154;
(Continued)

(56) References Cited

U.S. PATENT DOCUMENTS 4,297,885 A * 11/1981 Hein, Jr. .................. G01H 1/00
73/587
6,315,423 B1 * 11/2001 Yu ...................... G02B 26/0841
359/224.1
(Continued)

FOREIGN PATENT DOCUMENTS

DE  10-2009-000429 A1  7/2010
EP        2453570 A2  5/2012
(Continued)

OTHER PUBLICATIONS

Extended European Search Report for Application No. EP 15 16 0269 dated Jul. 24, 2015 (5 pages).

*Primary Examiner* — Bumsuk Won
*Assistant Examiner* — Balram T Parbadia
(74) *Attorney, Agent, or Firm* — Harness, Dickey & Pierce, P.L.C.

(57) ABSTRACT

An optical scanner includes: a movable part including a light reflection portion that reflects light; a first shaft part that swingably supports the movable part about a first axis; a support part that supports the first shaft part; a recessed portion provided in the support part, and having an opening portion in one surface of the support part and having a side surface opening portion in a side surface of the support part connected to the one surface of the support part; and a regulating member provided in the recessed portion and partially projecting from the side surface opening portion with the projecting portion located between the support part and the movable part.

20 Claims, 22 Drawing Sheets

(51) Int. Cl.
*G02B 26/08* (2006.01)
*G02B 27/01* (2006.01)
*H04N 5/232* (2006.01)

(58) Field of Classification Search
CPC .. B81B 3/0078; B81B 7/0016; Y10S 359/904
See application file for complete search history.

(56) References Cited

U.S. PATENT DOCUMENTS

| | | | |
|---|---|---|---|
| 6,360,605 B1 * | 3/2002 | Pinter | B81B 3/0008 |
| | | | 73/514.32 |
| 6,736,521 B1 | 5/2004 | Turner | |
| 7,605,965 B2 | 10/2009 | Tani et al. | |
| 7,905,146 B2 * | 3/2011 | Suzuki | G01C 19/56 |
| | | | 73/514.33 |
| 8,596,123 B2 * | 12/2013 | Schultz | B81B 3/0016 |
| | | | 73/514.32 |
| 2003/0142426 A1 | 7/2003 | Turner | |
| 2004/0046940 A1 * | 3/2004 | Yanagisawa | H04N 9/3105 |
| | | | 353/31 |
| 2007/0014512 A1 | 1/2007 | Turner | |
| 2009/0180167 A1 | 7/2009 | Tani et al. | |
| 2010/0219716 A1 | 9/2010 | Akashi et al. | |
| 2011/0199582 A1 * | 8/2011 | Kuriki | A61B 3/1225 |
| | | | 353/31 |
| 2014/0310914 A1 * | 10/2014 | Erlich | B81C 1/00523 |
| | | | 16/225 |

FOREIGN PATENT DOCUMENTS

| | | |
|---|---|---|
| JP | 2004-264702 A | 9/2004 |
| JP | 2007-152497 A | 6/2007 |
| JP | 2009-169089 A | 7/2009 |
| JP | 2013-109359 A | 6/2013 |

* cited by examiner

OPTICAL SCANNER, IMAGE DISPLAY DEVICE, AND HEAD MOUNTED DISPLAY

BACKGROUND

1. Technical Field

The present invention relates to an optical scanner, an image display device, and a head mounted display.

2. Related Art

For example, Patent Document 1 (JP-A-2013-109359) discloses an optical scanner including a mirror part having a reflection surface, a torsion bar that swingably supports the mirror part, a support part that supports the torsion bar. Further, the optical scanner of Patent Document 1 has an impact relaxation part provided in an air gap between the mirror part and the support part, and the impact relaxation part prevents breakage of the mirror part due to collision with the support part. Furthermore, these respective parts are integrally formed by patterning of a silicon substrate using an etching technique.

However, in the optical scanner of Patent Document 1, spaces around the mirror part vary. That is, the space between the mirror part and the impact relaxation part is small compared to the space between the mirror part and the support part, and the shape of the impact relaxation part is very minute compared to the other parts. Accordingly, if the silicon substrate is patterned by etching, the amounts of processing vary in the respective parts of the silicon substrate due to differences in etching opening size, and manufacturing of the optical scanner is difficult.

Specifically, in order to form the impact relaxation part with higher accuracy, the etching time is longer. Then, the mirror part and the torsion bar are excessively etched, and the mirror part becomes smaller and the torsion bar becomes thinner. On the other hand, in order to form the mirror part and the torsion bar with higher accuracy, the etching time is shorter. Then, the etching may be ended before the impact relaxation part is formed.

SUMMARY

An advantage of some aspects of the invention is to provide an optical scanner, an image display device, and ahead mounted display by which a predetermined shape may be easily obtained and breakage may be suppressed by regulation of excessive displacement of a movable part.

The advantage can be implemented as the following aspects of the invention.

An optical scanner according to an aspect of the invention includes a movable part including alight reflection portion that reflects light, a first shaft part that swingably supports the movable part about a first axis, a support part that supports the first shaft part, a recessed portion provided in the support part, and having an opening portion in one surface of the support part and having a side surface opening portion in a side surface of the support part connected to the one surface of the support part, and a regulating member provided in the recessed portion and partially projecting from the side surface opening portion with the projecting portion located between the support part and the movable part.

According to this configuration, variations of the spaces around the movable part are suppressed, and it is unnecessary to form excessively minute parts for other parts. Accordingly, the optical scanner that can easily obtain a predetermined shape and regulates excessive displacement of the movable part to suppress breakage may be obtained.

In the optical scanner according to the aspect of the invention, it is preferable that the regulating member comes into contact with the movable part to regulate displacement of the movable part when an impact is applied to the optical scanner.

According to this configuration, excessive displacement of the movable part may be regulated and breakage of the optical scanner may be reduced.

An optical scanner according to another aspect of the invention includes a movable part including a light reflection portion that reflects light, a first shaft part that swingably supports the movable part about a first axis, a support part that supports the first shaft part, a recessed portion provided in the support part, and having an opening portion in one surface of the support part and having a side surface opening portion in a side surface of the support part connected to the one surface of the support part, and a regulating member provided in the recessed portion and partially projecting from the side surface opening portion with the projecting portion located between the support part and the first shaft part.

According to this configuration, variations of the spaces around the movable part are suppressed, and it is unnecessary to form excessively minute parts for other parts. Accordingly, the optical scanner that can easily obtain a predetermined shape and regulates excessive displacement of the movable part to suppress breakage may be obtained.

In the optical scanner according to the aspect of the invention, it is preferable that the regulating member comes into contact with the first shaft part to regulate displacement of the first shaft part when an impact is applied to the optical scanner.

According to this configuration, excessive displacement and deformation of the first shaft part may be regulated and breakage of the optical scanner may be reduced.

In the optical scanner according to the aspect of the invention, it is preferable that a connecting portion that connects the regulating member and the shaft part is provided and a Young's modulus of the connecting portion is equal to or less than one fiftieth of a Young's modulus of the first shaft part.

According to this configuration, excessive displacement and deformation of the first shaft part may be regulated more effectively because of synergistic effect of the regulating member and the connecting portion. Further, the connecting portion becomes sufficiently softer and does not substantially affect the vibration characteristics.

In the optical scanner according to the aspect of the invention, it is preferable that the connecting portion is formed using silicone resin.

According to this configuration, the configuration of the connecting portion becomes simpler.

In the optical scanner according to the aspect of the invention, it is preferable that a Young's modulus of the regulating member is equal to or less than one fiftieth of a Young's modulus of the movable part or the first shaft part.

According to this configuration, impacts when the movable part and the shaft part collide with the regulating member may be relaxed, and the optical scanner becomes harder to be broken. Further, unnecessary vibrations when the movable part and the shaft part collide with the regulating member may be reduced.

In the optical scanner according to the aspect of the invention, it is preferable that the regulating member is formed using a metal brazing material.

According to this configuration, the configuration of the regulating member becomes simpler. Further, the shape accuracy of the regulating member becomes higher and, for example, the separate distances between the movable part and the shaft part and the regulating member may be controlled with higher accuracy.

In the optical scanner according to the aspect of the invention, it is preferable that the regulating member is formed using a resin. Thereby, the configuration of the regulating member becomes simpler. Further, the regulating member may be made sufficiently softer.

In the optical scanner according to the aspect of the invention, it is preferable that the regulating member has a core part and a resin layer covering the core part.

According to this configuration, the configuration of the regulating member becomes simpler.

In the optical scanner according to the aspect of the invention, it is preferable that the recessed portion has a circular shape with a loss in a location of the side surface opening portion in a plan view.

According to this configuration, the shape of the recessed portion becomes simpler and easier to be formed.

In the optical scanner according to the aspect of the invention, it is preferable that the movable part has a first movable part, a second movable part in a frame shape provided to surround the first movable part, and a second shaft part that connects the first movable part and the second movable part and swingably supports the first movable part about a second axis intersecting with the first axis with respect to the second movable part.

According to this configuration, the movable part may be swung about the two axes of the first and second axes.

In the optical scanner according to the aspect of the invention, it is preferable that the first movable part has a base portion swingably supported by the second shaft part and a hold portion fixed to the base part and located on the one surface side, and provided to cover the base portion in the plan view, and the light reflection portion is provided in the hold portion.

According to this configuration, the light reflection portion may be made larger.

In the optical scanner according to the aspect of the invention, it is preferable that the hold portion overlaps with the regulating member in the plan view and the regulating member projects from the opening portion to the hold portion side.

According to this configuration, the excessive displacement of the movable part in its thickness direction may be regulated, and the optical scanner becomes harder to be broken.

An image display device according to still another aspect of the invention includes the optical scanner according to the aspect of the invention.

According to this configuration, the image display device with higher reliability is obtained.

A head mounted display according to yet another aspect of the invention includes the optical scanner according to the aspect of the invention and a frame attached to a head of an observer with the optical scanner mounted thereon.

According to this configuration, the head mounted display with higher reliability is obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

As below, embodiments of an optical scanner, an image display device, and a head mounted display according to the invention will be explained with reference to the accompanying drawings.

1. Image Display Device

First, an image display device according to the invention will be explained.

First Embodiment

Figure 1:
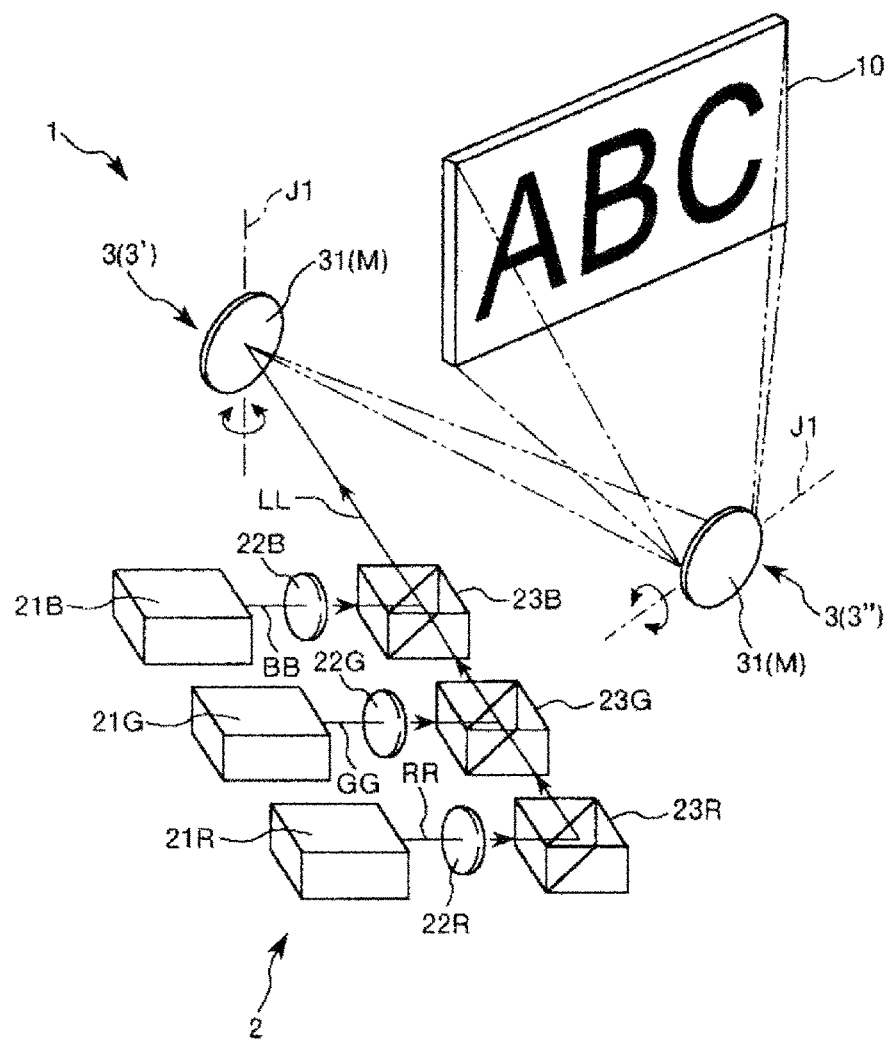
FIG. 1 is a configuration diagram showing the first embodiment of an image display device according to the invention.
Figure 2:
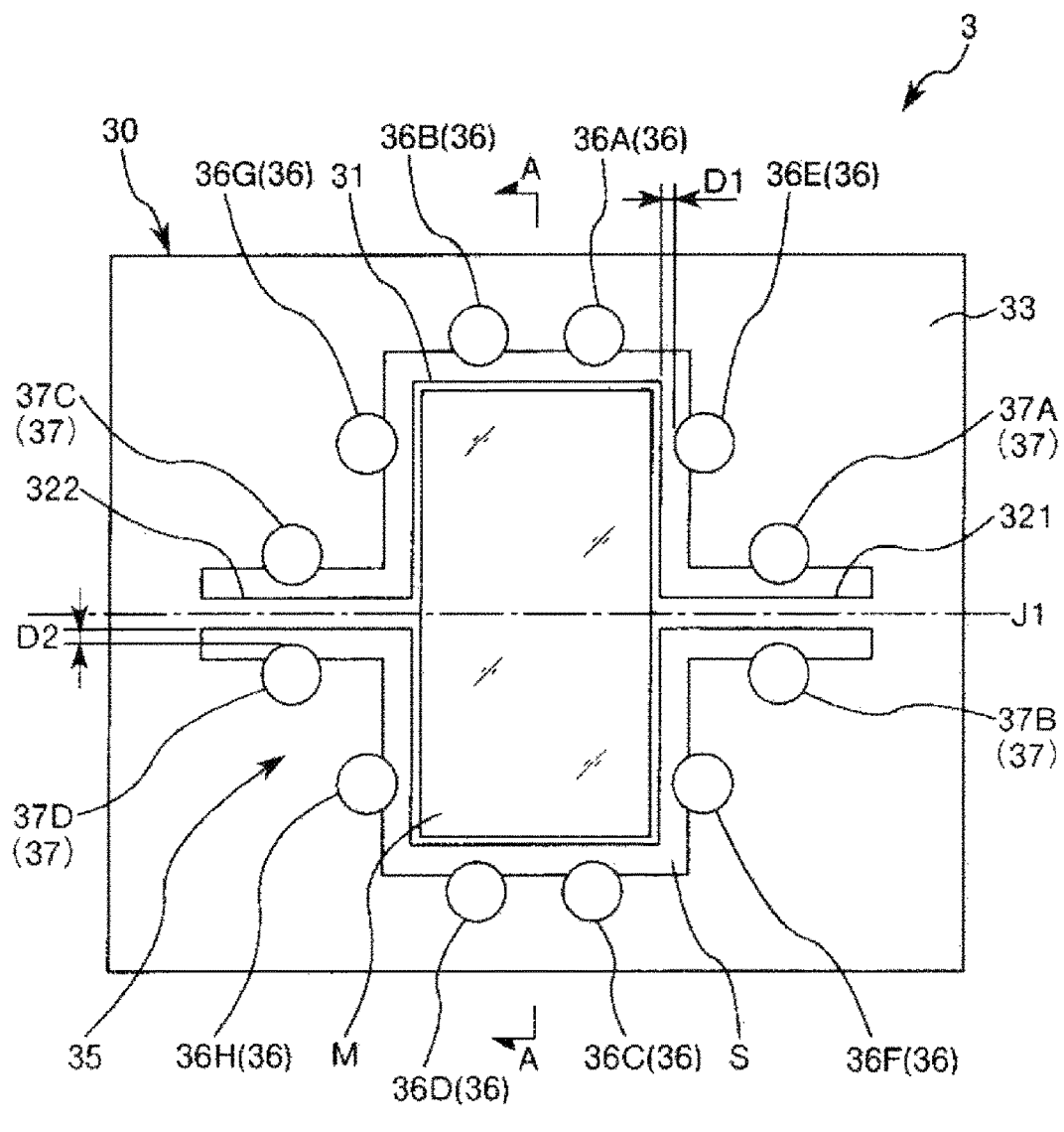
FIG. 2 is a top view of an optical scanner of the image display device shown in FIG. 1.
Figure 3:
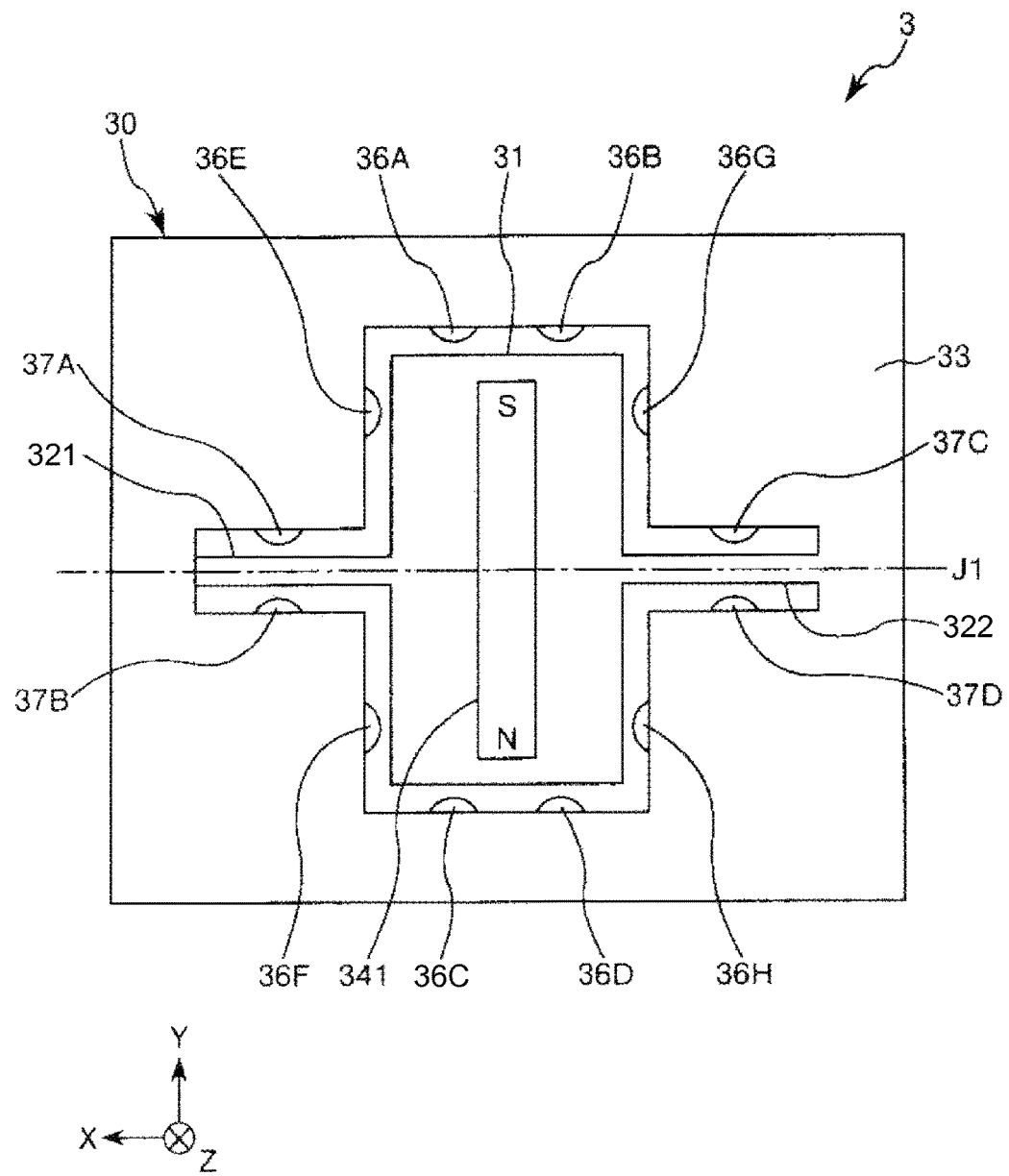
FIG. 3 is a bottom view of the optical scanner shown in FIG. 2.
Figure 4:
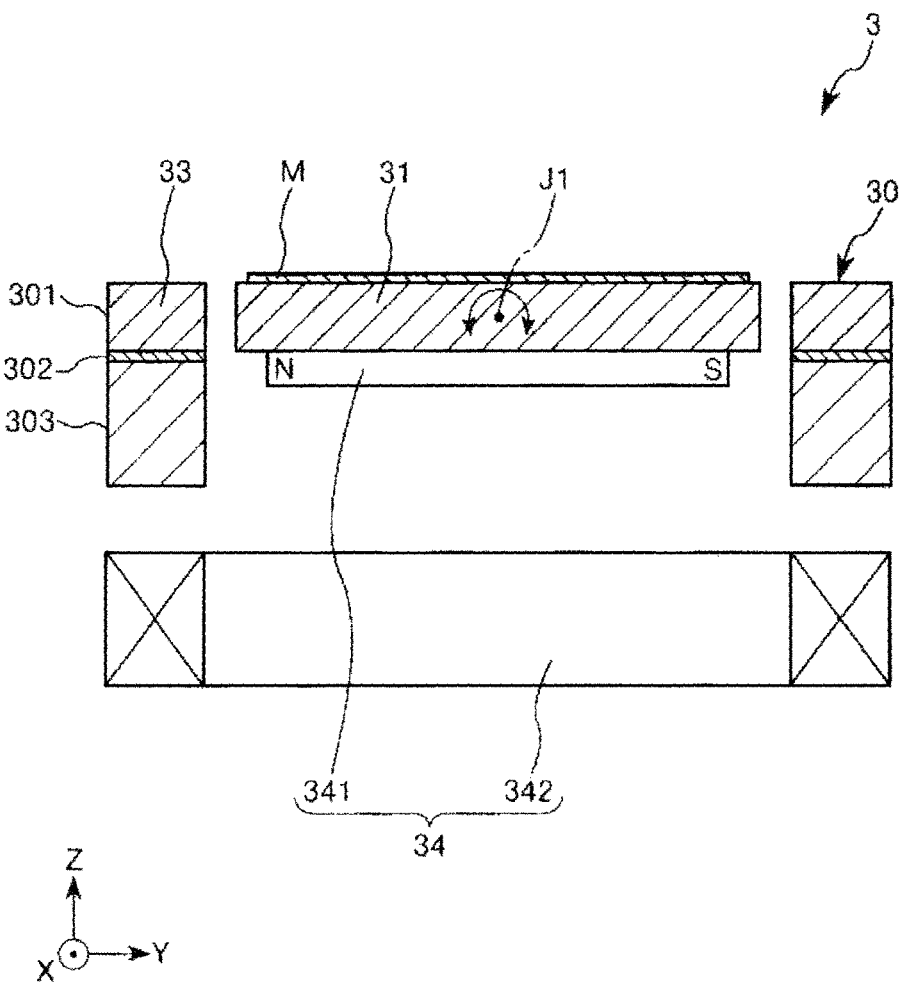
FIG. 4 is a sectional view along A-A line in FIG. 2.
Figure 5A:
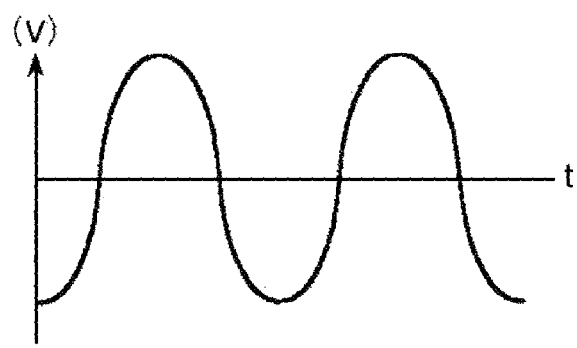
FIGS. 5A and 5B show voltages applied to a coil shown in FIG. 4.
Figure 5B:
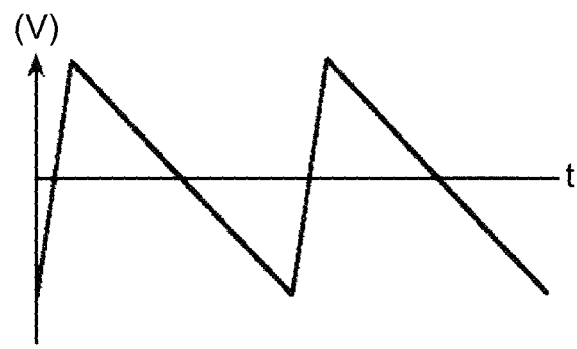
Figure 6:
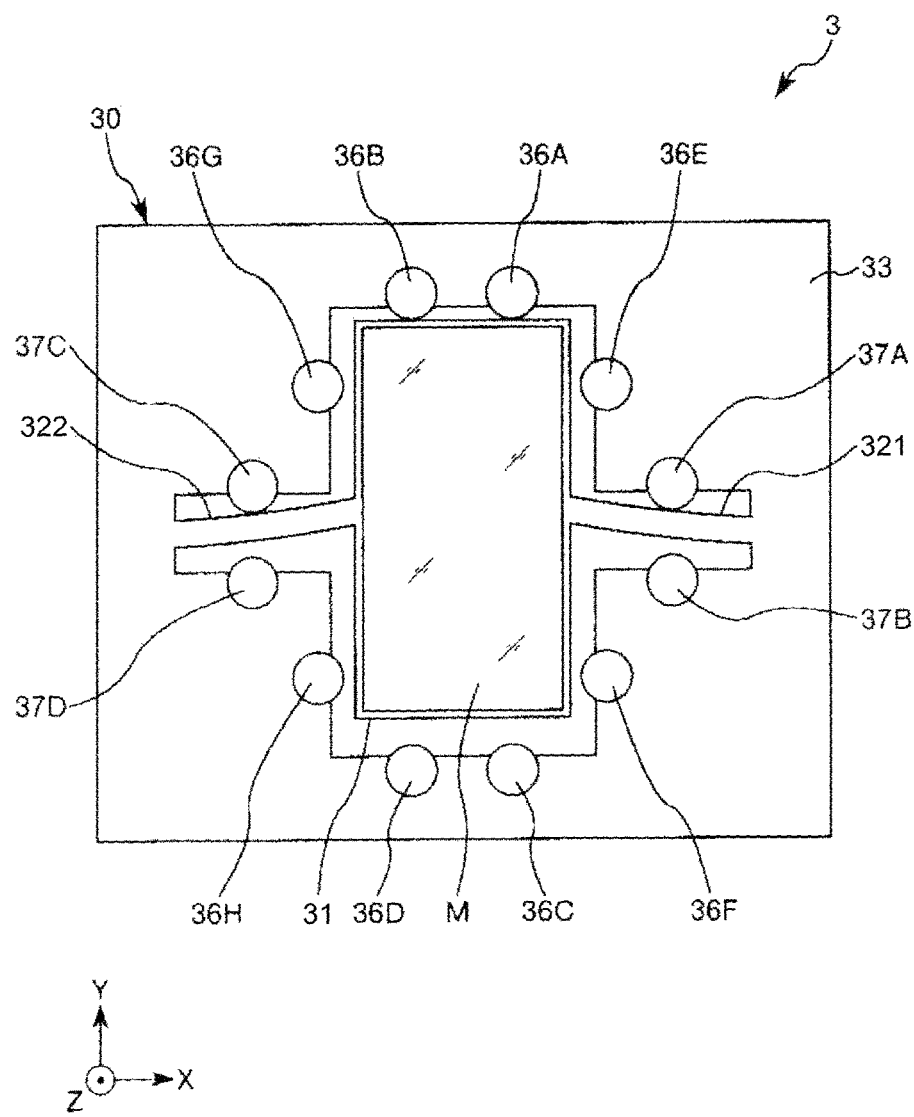
FIG. 6 is a plan view for explanation of a function of a regulating member.
Figure 7:
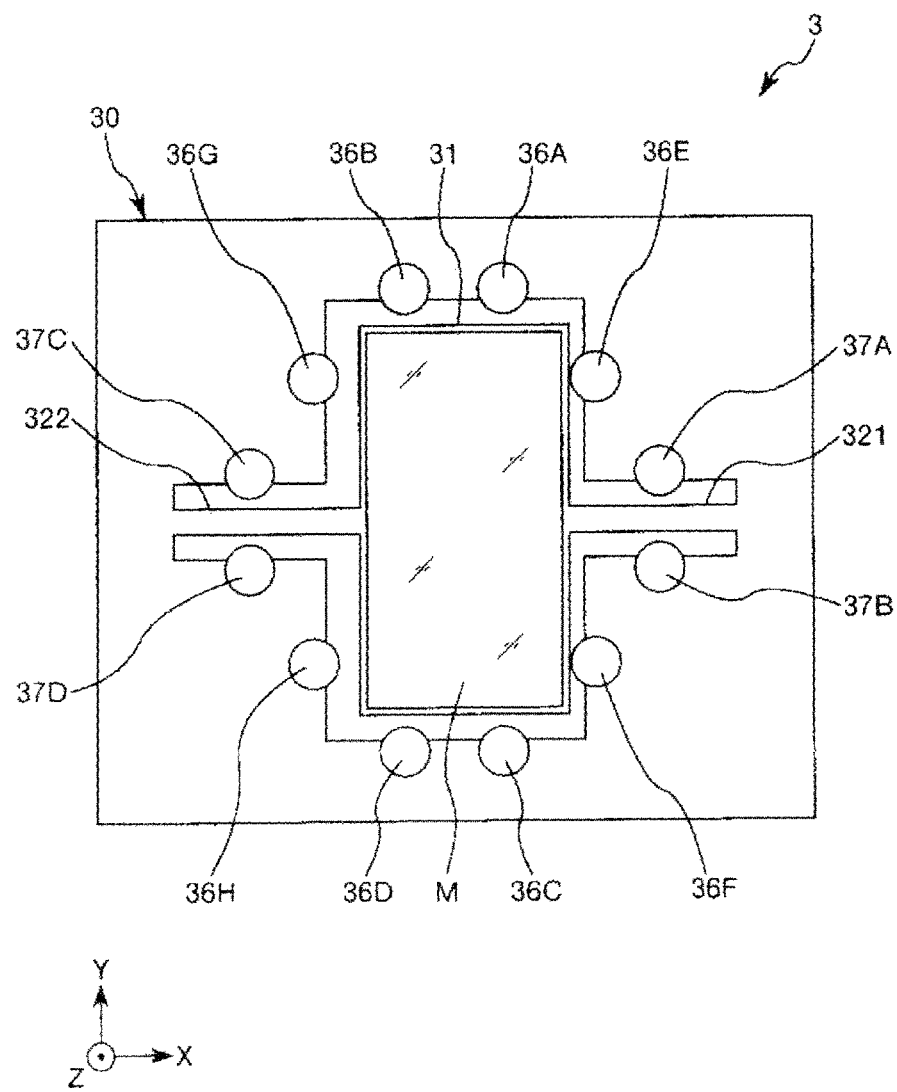
FIG. 7 is a plan view for explanation of the function of the regulating member.
Figure 8A:
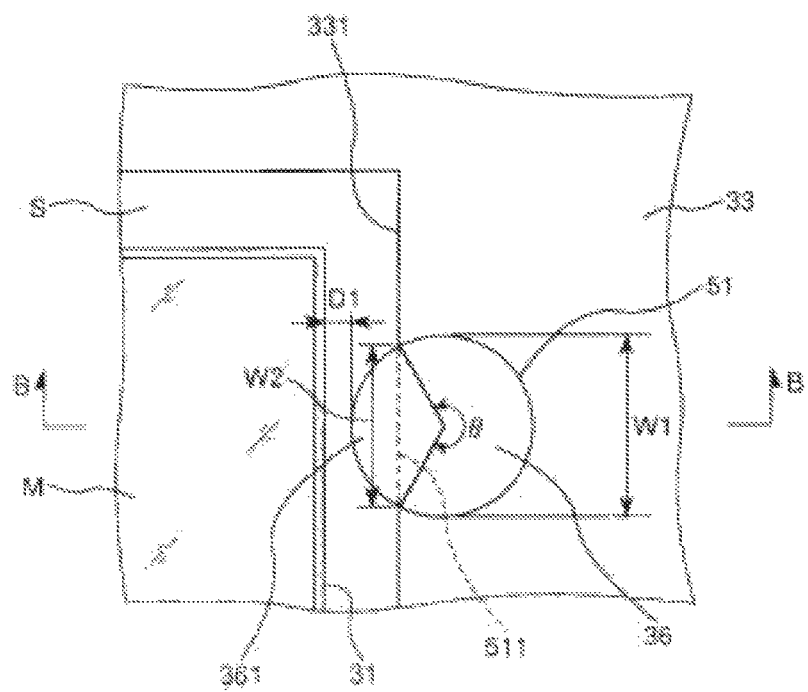
FIGS. 8A and 8B are a plan view and a sectional view showing a movable part regulating member.
Figure 8B:
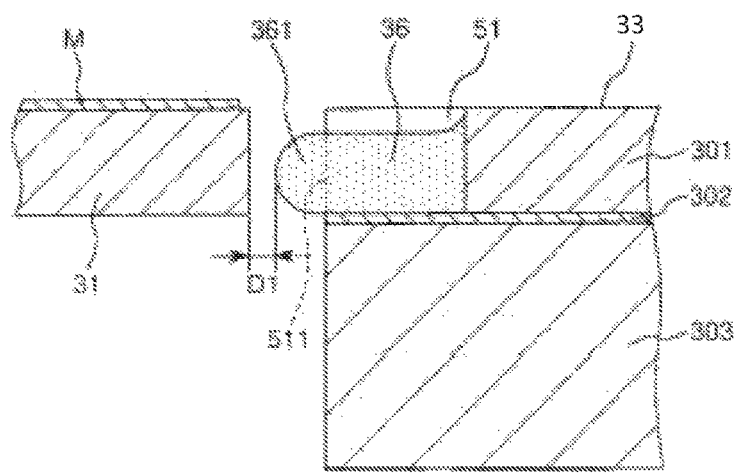
Figure 9A:
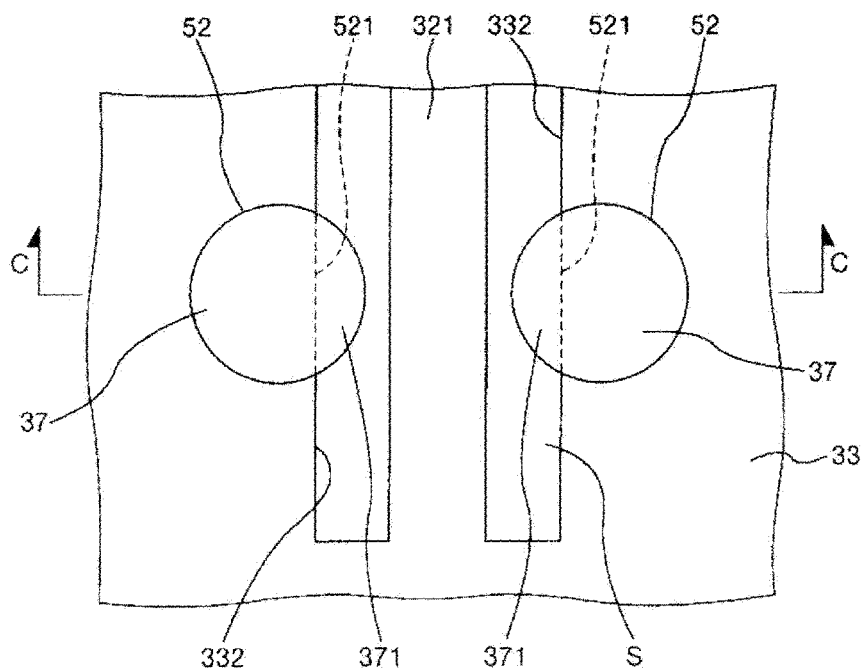
FIGS. 9A and 9B are a plan view and a sectional view showing shaft part regulating members.
Figure 9B:
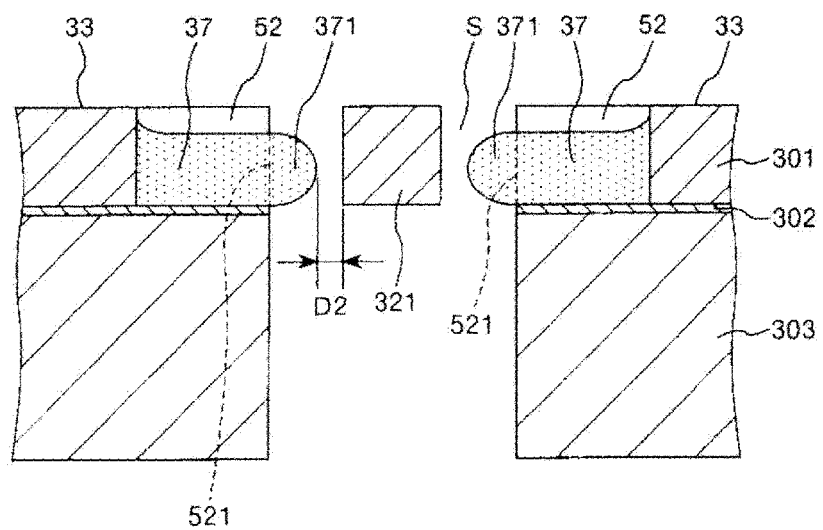
Figure 10A:
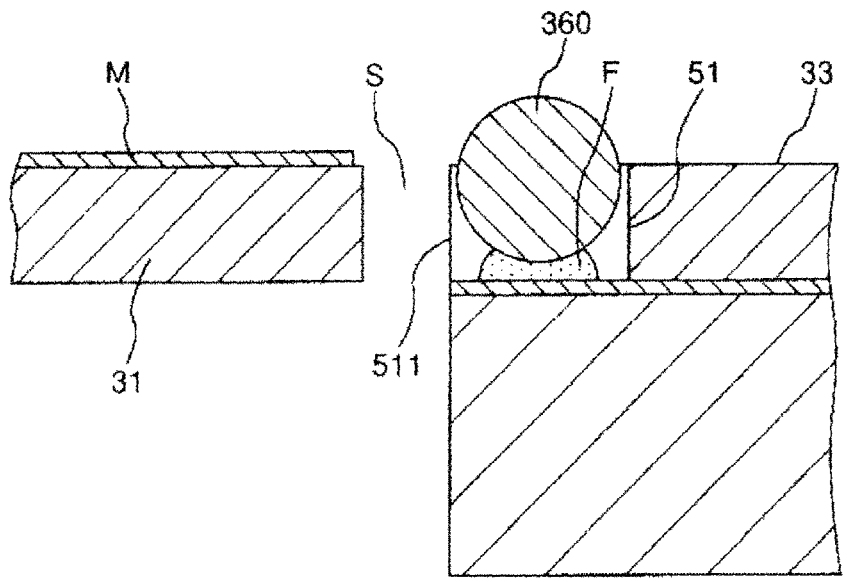
FIGS. 10A and 10B are sectional views for explanation of a method of forming the movable part regulating member.
Figure 10B:
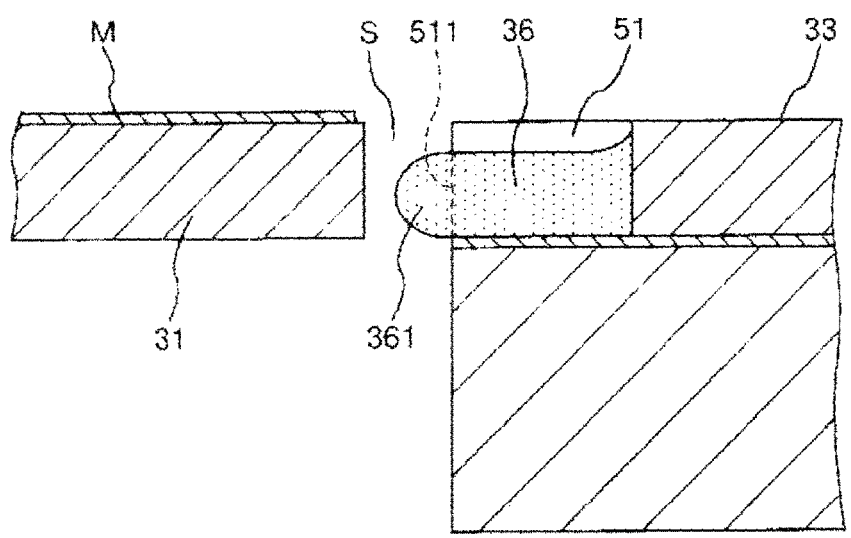

FIG. 1 is a configuration diagram showing the first embodiment of the image display device according to the invention. FIG. 2 is a top view of an optical scanner of the image display device shown in FIG. 1. FIG. 3 is a bottom view of the optical scanner shown in FIG. 2. FIG. 4 is a sectional view along A-A line in FIG. 2. FIGS. 5A and 5B show voltages applied to a coil shown in FIG. 4. FIGS. 6 and 7 are plan views for explanation of a function of a regulating member. FIGS. 8A and 8B are a plan view and a sectional view showing a movable part regulating member. FIGS. 9A and 9B are a plan view and a sectional view showing shaft part regulating members. FIGS. 10A and 10B are sectional views for explanation of a method of forming the movable part regulating member. Hereinafter, for convenience of explanation, the +Z-axis side is also referred to as "upper" and the −Z-axis side is also referred to as "lower".

As shown in FIG. 1, an image display device 1 is a device that displays an image by two-dimensional scanning of an object 10 such as a screen or wall surface with drawing laser light LL. The image display device 1 has a drawing light source unit 2 that outputs the drawing laser light LL, and two optical scanners 3 that scan with the drawing laser light LL. In the image display device 1, the two optical scanners 3 are provided so that the scanning directions of the drawing laser light LL (or first axes J1, which will be described later) may be orthogonal to each other. For example, one optical scanner 3 horizontally scans with the drawing laser light LL and the other optical scanner 3 vertically scans with the drawing laser light LL, and thereby, a two-dimensional image may be displayed on the object 10. Hereinafter, the optical scanner 3 that horizontally scans with the drawing laser light LL is also referred to as "optical scanner 3' for horizontal scanning" and the optical scanner 3 that vertically scans with the drawing laser light LL is also referred to as "optical scanner 3" for vertical scanning".

Drawing Light Source Unit

As shown in FIG. 1, the drawing light source unit 2 includes laser light sources (light source parts) 21R, 21G, 21B of the respective colors of red, green, blue, and collimator lenses 22R, 22G, 22B and dichroic mirrors 23R, 23G, 23B provided in correspondence with the laser light sources 21R, 21G, 21B.

The laser light sources 21R, 21G, 21B each has alight source and a drive circuit (not shown). Further, the laser light source 21R outputs a red laser beam RR, the laser light source 21G outputs a green laser beam GG, and the laser light source 21B outputs a blue laser beam BB. The laser beams RR, GG, BB are output in response to drive signals transmitted from a control part (not shown) and parallelized or nearly parallelized by the collimator lenses 22R, 22G, 22B. As the laser light sources 21R, 21G, 21B, e.g., semiconductor lasers such as edge emitting semiconductor lasers or surface emitting semiconductor lasers may be used. The laser light sources 21R, 21G, 21B may be downsized using the semiconductor lasers.

According to the arrangement of the laser light sources 21R, 21G, 21B, the dichroic mirrors 23R, 23G, 23B are provided. The dichroic mirror 23R has a property of reflecting the laser beam RR. The dichroic mirror 23G has a property of reflecting the laser beam GG and transmitting the laser beam RR. The dichroic mirror 23B has a property of reflecting the laser beam BB and transmitting the laser beams RR, GG. These dichroic mirrors 23R, 23G, 23B combine the respective color laser beams RR, GG, BB into the drawing laser light LL.

Optical Scanner

The optical scanner 3 shown in FIGS. 2 to 4 includes a structure 30 having a movable part 31 with a light reflection portion M, a pair of shaft parts (first shaft parts) 321, 322, and a support part 33, a drive unit 34 configured to swing the movable part 31, and a regulating member 35 that regulates (restricts) excessive displacement of the movable part 31 and excessive deformation of the shaft parts 321, 322.

Hereinafter, for convenience of explanation, three axes orthogonal to one another are referred to as an X-axis, a Y-axis, and a Z-axis, and the Z-axis directions are aligned with the thickness direction of the movable part 31 (structure 30) and the X-axis directions are aligned with the first axis J1. Further, the plan view as seen in the Z-axis direction is also simply referred to as "plan view".

The movable part 31 has a plate-like shape and the light reflection portion M having light reflectivity is provided on the upper surface thereof. The light reflection portion M may be formed by e.g., a metal film of aluminum or the like. As shown in FIG. 1, the drawing laser light LL enters the movable part 31, the incident drawing laser light LL is reflected by the light reflection portion M and scanning is performed in the direction in response to the attitude of the light reflection portion M (movable part 31).

The shaft parts 321, 322 are provided to be opposed to each other via the movable part 31. Further, the shaft parts 321, 322 respectively extend along the first axis J1 and their one ends are connected to the movable part 31 and the other ends are connected to the support part 33. These shaft parts 321, 322 respectively support the movable part 31 swingably about the first axis J1 and torsionally deform with the swing of the movable part 31 about the first axis J1. Note that the shapes of the shaft parts 321, 322 are respectively not limited to the above described shapes and may have e.g., bended or curved parts or branched parts in at least one location in the middle. Further, the shaft parts 321, 322 may be respectively divided into two shaft parts.

The support part 33 has a frame shape and is provided to surround the movable part 31 in the plan view. Further, as shown in FIG. 4, the support part 33 is thicker than the movable part 31 and the shaft parts 321, 322. Thereby, rigidity of the support part 33 may be increased and the movable part 31 and the shaft parts 321, 322 may be supported more stably. Note that the configuration of the support part 33 is not limited to that. For example, the support part 33 may be divided in two and the two support parts 33 may be provided to be opposed in the X-axis directions via the movable part 31. As below, for convenience of explanation, an opening formed between the support part 33 and the movable part 31 and the shaft parts 321, 322 is also referred to as "air gap S".

The structure 30 is integrally formed by etching of an SOI substrate [a substrate in which a first Si layer (device layer) 301, an $SiO_2$ layer (BOX layer) 302, a second Si layer (handle layer) 303 are sequentially stacked] using various etching techniques including wet etching and reactive ion etching (RIE). Specifically, of the structure 30, the movable part 31 and the shaft parts 321, 322 are formed by the first Si layer 301 of the SOI substrate. Further, the support part 33 is formed by a laminated structure of the first Si layer 301, the $SiO_2$ layer 302, and the second Si layer 303. The structure 30 is formed by the SOI substrate, and thereby, the vibration characteristics of the optical scanner 3 may be made better. Furthermore, microfabrication can be performed on the SOI substrate by etching and the structure 30 is formed by the SOI substrate, and thereby, the dimensional accuracy of them may be made better and the optical scanner 3 may be downsized.

Further, as shown in FIG. 4, the drive unit 34 has a permanent magnet 341 provided on the lower surface of the movable part 31 and a coil 342 provided to be opposed to the permanent magnet 341. As shown in FIG. 3, the permanent magnet 341 is provided so that the S-pole may be located on one side of the first axis J1 (+Y-axis side) and the N-pole may be located on the other side (−Y-axis side) in the plan view. As the permanent magnet 341, e.g., neodymium magnet, ferrite magnet, samarium-cobalt magnet, alnico magnet, bonded magnet, or the like may be preferably used.

In the drive unit 34, an alternating voltage is applied to the coil 342, and thereby, the movable part 31 may be swung about the first axis J1. Specifically, when an alternating voltage is applied to the coil 342, a first magnetic field that attracts the N-pole of the permanent magnet 341 toward the coil 342 and separates the S-pole from the coil 342 and, oppositely, a second magnetic field that separates the N-pole of the permanent magnet 341 from the coil 342 and attracts the S-pole toward the coil 342 are alternately switched around the coil 342. In this manner, the first and second magnetic fields are alternately switched, and the movable part 31 may be swung about the first axis J1 with the shaft parts 321, 322 torsionally deformed.

Here, regarding the optical scanner 3' for horizontal scanning of the two optical scanners 3, it is preferable to apply an alternating voltage at a frequency equal to the torsional resonance frequency of the vibration system including the movable part 31 and the shaft parts 321, 322 to the coil 342 for resonant vibration of the movable part 31. Thereby, the swing angle about the first axis J1 of the movable part 31 may be made larger. The frequency of the alternating voltage is not particularly limited, e.g., preferably about 10 to 40 kHz. Further, the waveform of the alternating voltage is not particularly limited, but preferably a waveform like sine wave as shown in FIG. 5A.

On the other hand, regarding the optical scanner 3" for vertical scanning, it is preferable to apply an alternating voltage at a frequency different from the torsional resonance frequency of the vibration system including the movable part 31 and the shaft parts 321, 322 to the coil 342 for non-resonant vibration of the movable part 31. The frequency of the alternating voltage is not particularly limited, e.g., preferably about 30 to 120 Hz (about 60 Hz). Further, the waveform of the alternating voltage is not particularly limited, but preferably a waveform like sawtooth wave as shown in FIG. 5B.

The regulating member 35 is provided for suppressing excessive deformation of the shaft parts 321, 322 with excessive displacement of the movable part 31 with respect to the support part 33 when an impact (acceleration in the XY in-plane direction) is applied to the optical scanner 3 due to falling or the like. The regulating member 35 is provided, and thereby, breakage (damage, rupture) of the shaft parts 321, 322 may be suppressed. Accordingly, mechanical strength (impact resistance) of the optical scanner 3 becomes higher.

As shown in FIG. 2, the regulating member 35 has movable part regulating members 36 that regulate excessive displacement of the movable part 31 and shaft part regulating members 37 that regulate excessive deformation of the shaft parts 321, 322. The movable part regulating members 36 project from the inner side surface of the support part 33 toward the movable part 31 and the projecting portions are located (in the air gap S) between the support part 33 and the movable part 31. Accordingly, the separate distance D1 between the movable part regulating member 36 and the movable part 31 is shorter than the other parts (the parts without the movable part regulating member 36). On the other hand, the shaft part regulating members 37 project from the inner side surface of the support part 33 toward the shaft parts 321, 322 and the projecting portions are located (in the air gap S) between the support part 33 and the shaft parts 321, 322. Accordingly, the separate distance D2 between the shaft part regulating member 37 and the shaft parts 321, 322 is shorter than the other parts (the parts without the shaft part regulating member 37).

The separate distances D1, D2 are not particularly limited, but preferably e.g., about from 5 μm to 30 μm depending on the size of the optical scanner 3.

Further, a plurality (eight in the embodiment) of the movable part regulating members 36 are provided around the movable part 31. Specifically, as shown in FIG. 2, the regulating member 35 has a pair of movable part regulating members 36A, 36B provided to be opposed to the outer side surface at the +Y-axis side of the movable part 31, a pair of movable part regulating members 36C, 36D provided to be opposed to the outer side surface at the −Y-axis side of the movable part 31, a pair of movable part regulating members 36E, 36F provided to be opposed to the outer side surface at the +X-axis side of the movable part 31, and a pair of movable part regulating members 36G, 36H provided to be opposed to the outer side surface at the −X-axis side of the movable part 31. Further, the movable part regulating members 36A, 36B and the movable part regulating members 36C, 36D are provided on the opposite sides to each other with respect to the Y-axis intersecting with the center of gravity of the movable part 31, and the movable part regulating members 36E, 36F and the movable part regulating members 36G, 36H are provided on the opposite sides to each other with respect to the first axis J1. Note that the arrangement and number of the movable part regulating members 36 are not limited to those described above.

Similarly, a plurality (four in the embodiment) of the shaft part regulating members 37 are provided around the shaft parts 321, 322. Specifically, the regulating member 35 has a pair of shaft part regulating members 37A, 37B provided to be opposed in the Y-axis directions via the shaft part 321 and a pair of shaft part regulating members 37C, 37D provided to be opposed in the Y-axis directions via the shaft part 322. Note that the arrangement and number of the shaft part regulating members 37 are not limited to those described above.

According to the regulating member 35 (movable part regulating members 36 and shaft part regulating members 37), for example, when excessive acceleration is applied in the −Y-axis direction, as shown in FIG. 6, the movable part 31 is displaced in the +Y-axis direction and collides with the movable part regulating members 36A, 36B. Thereby, more displacement of the movable part 31 is regulated. Further, the shaft parts 321, 322 flexurally deform in the +Y-axis direction and collide with the shaft part regulating members 37A, 37C. Thereby, more deformation of the shaft parts 321, 322 is regulated. In this manner, the excessive displacement of the movable part 31 is regulated and the excessive deformation of the shaft parts 321, 322 is regulated. Similarly, for example, when an excessive velocity is applied in the −X-axis direction, as shown in FIG. 7, the movable part 31 is displaced in the +X-axis direction and collides with the movable part regulating members 36E, 36F. Thereby, more displacement of the movable part 31 is regulated, and accordingly, excessive deformation (expansion, contraction) of the shaft parts 321, 322 is regulated. In this manner, breakage of the shaft parts 321, 322 is suppressed and the optical scanner 3 with higher mechanical strength (impact resistance) may be obtained.

As above, the regulating member 35 is briefly explained. Next, the specific configurations of the movable part regulating members 36 and the shaft part regulating members 37 will be explained in detail. The movable part regulating members 36A to 36H and the shaft part regulating members 37A to 37D have the same configuration as each other except the locations where they are provided.

As shown in FIGS. 8A and 8B, the support part 33 has recessed portions 51 opening to the upper surface, and the recessed portion 51 has an opening portion (side surface opening portion) 511 opening to an inner side surface 331 connecting to the upper surface of the support part 33 and extending along the periphery of the movable part 31. In other words, the recessed portion 51 has an opening portion in the upper surface of the support part 33 and an opening portion (side surface opening portion) in the inner side surface 331 connecting to the upper surface of the support part 33. The movable part regulating member 36 is provided within the recessed portion 51 and part thereof projects from the opening portion 511 into the air gap S, and a projecting portion 361 as the projecting part is located between the inner side surface 331 and the movable part 31. Thereby, as described above, the separate distance D1 between the movable part regulating member 36 and the movable part 31 may be made shorter than the other parts. Note that the recessed portion 51 is formed in the first Si layer 301 of the SOI substrate, and the height of the movable part regulating member 36 (location in the Z-axis directions) may be made equal to the height of the movable part 31. That is, the projecting portion 361 may be opposed to the side surface of the movable part 31.

Similarly, As shown in FIGS. 9A and 9B, the support part 33 has recessed portions 52 opening to the upper surface, and the recessed portion 52 has an opening portion (side surface opening portion) 521 opening toward an inner side surface 332 connecting to the upper surface of the support part 33 and extending along the shaft parts 321, 322. In other words, the recessed portion 52 has an opening portion in the upper surface of the support part 33 and an opening portion (side surface opening portion) in the inner side surface 332 connecting to the upper surface of the support part 33.

The shaft part regulating member 37 is provided within the recessed portion 52 and part thereof projects from the opening portion 521 into the air gap S, and a projecting portion 371 as the projecting part is located between the inner side surface 332 and the shaft parts 321, 322. Thereby, as described above, the separate distance D2 between the shaft part regulating member 37 and the shaft parts 321, 322 may be made shorter than the other parts. Note that the recessed portion 52 is also formed in the first Si layer 301 of the SOI substrate, and the height of the shaft part regulating member 37 (location in the Z-axis directions) may be made equal to the height of the shaft parts 321, 322. That is, the projecting portions 371 may be opposed to the side surfaces of the shaft parts 321, 322.

As described above, the movable part regulating members 36 and the shaft part regulating members 37 are provided in the structure 30 separately from the structure 30, and the following effects are exerted. As the first effect, patterning of the structure 30 may be performed with higher accuracy by the etching technique. That is, in the structure 30 without the movable part regulating members 36 and the shaft part regulating members 37, the differences among widths (the separate distances between the movable part 31 and the shaft parts 321, 322 and the support part 33) may be suppressed to be smaller in the respective locations of the air gap S, and the differences among processing times (times required for etching) are smaller in the respective locations. Accordingly, the dimensional accuracy of the respective parts of the structure 30 may be made higher. Further, as the second effect, the structure 30 may be downsized because of separate configurations of the movable part regulating members 36 and the shaft part regulating members 37.

The movable part regulating member 36 is preferably softer as long as its function can be fulfilled. Specifically, the Young's modulus is preferably equal to or less than one fiftieth and more preferably equal to or less than one hundredth of the Young's modulus of the movable part 31. Similarly, the shaft part regulating member 37 is preferably softer as long as its function can be fulfilled. Specifically, the Young's modulus is preferably equal to or less than one fiftieth and more preferably equal to or less than one hundredth of the Young's modulus of the shaft parts 321, 322. As described above, the movable part regulating members 36 and the shaft part regulating members 37 are made softer, and thereby, the impacts when the movable part 31 and the shaft parts 321, 322 collide with the movable part regulating members 36 and the shaft part regulating members 37 may be relaxed and breakage of the movable part 31 and the shaft parts 321, 322 may be effectively suppressed. Further, the impacts at collisions are relaxed, and unnecessary vibrations of the vibration system generated due to the collisions may be suppressed.

Further, the material of the movable part regulating members 36 and the shaft part regulating members 37 is not particularly limited, but a metal brazing material such as gold brazing, silver brazing, copper brazing, soldering (specifically, lead-free soldering) is preferably used. Of them, solder is more preferably used because of better workability. The solder is not particularly limited, but e.g., Au—Sn-based, Sn—Cu-based or Sn—Ag-based known solder may be used. As described above, the movable part regulating members 36 and the shaft part regulating members 37 are formed using the metal brazing material, and thereby, the dimensional accuracy of the movable part regulating members 36 and the shaft part regulating members 37 may be controlled with higher accuracy. Accordingly, the separate distances D1, D2 between the movable part 31 and the shaft parts 321, 322 and them may be controlled with higher accuracy, and the above described effects may be exerted more reliably.

When the movable part regulating members 36 and the shaft part regulating members 37 are formed using the metal brazing material, the movable part regulating members 36 and the shaft part regulating members 37 may be formed in the following manner. Note that the movable part regulating members 36 and the shaft part regulating members 37 may be formed in the same manner as each other, and the method of forming the movable part regulating member 36 will be representatively explained and the explanation of the method of forming the shaft part regulating member 37 will be omitted.

First, as shown in FIG. 10A, a solder ball 360 is provided in the recessed portion 51. In the embodiment, for prevention of rolling of the solder ball 360, a flux F is applied to the bottom surface of the recessed portion 51 in advance and the solder ball 360 is temporarily fixed utilizing viscosity of the flux F. Further, the flux F is applied, and thereby, wettability of the solder ball 360 is higher and the movable part regulating member 36 having a desired shape is easily obtained. Note that, in FIG. 10A, one larger solder ball 360 is placed in the recessed portion 51, however, the size and number of the solder ball 360 are not limited to those. For example, a plurality of smaller solder balls 360 may be placed in the recessed portion 51. Next, the solder ball 360 is reflowed (melted). Then, as shown in FIG. 10B, the molten solder ball 360 wets and spreads within the recessed portion 51 and partially projects from the opening portion 511 into the air gap S. Thereby, the movable part regulating member 36 having the projecting portion 361 is formed. According to the method, the amount of projection and shape of the projecting portion 361 may be controlled with higher accuracy utilizing surface tension of the molten solder, and the movable part regulating member 36 may be formed with the higher dimensional accuracy. Further, the projecting portion 361 is naturally rounded in a nearly spherical shape utilizing surface tension, and the damage on the movable part 31 may be reduced.

Particularly, in the embodiment, as shown in FIGS. 8A and 8B, the plan view shape of the recessed portion 51 has a nearly circular shape with a loss in the location of the opening portion (side surface opening portion) 511, and the solder may be allowed to wet and spread more evenly within the recessed portion 51. Accordingly, the dimensional accuracy of the projecting portion 361 may be made higher. Further, in the embodiment, the center angle θ of the circular arc along the outer edge of the recessed portion 51 is equal to or more than 180°, and the width W2 of the opening portion 511 is smaller than the maximum width W1 of the recessed portion 51. As described above, the wider portion than the opening portion 511 exists within the recessed portion 51 and the opening portion 511 is slightly closed, and excessive protrusion of the molten solder from the opening portion 511 may be effectively prevented. Accordingly, the dimensional accuracy of the projecting portion 361 may be made even higher. Further, it becomes easier to place the solder ball 360 within the recessed portion 51. Note that the plan view shape of the recessed portion 51 is not limited to that, but may be e.g., a nearly triangular shape, nearly rectangular shape, or the like with a loss in the location of the opening portion 511. Here, the recessed portion 51 is explained and the same applies to the recessed portion 52.

Note that, as described above, in the optical scanner 3 of the embodiment, the movable part regulating members 36 and the shaft part regulating members 37 are formed using the metal brazing material, however, the movable part regulating members 36 and the shaft part regulating members 37 may be formed using a resin material such as epoxy resin, phenol resin, silicone resin, or polyurethane resin. Thereby, the movable part regulating members 36 and the shaft part regulating members 37 may be made softer. Accordingly, the impacts when the movable part 31 and the shaft parts 321, 322 collide with the movable part regulating members 36 and the shaft part regulating members 37 may be relaxed more effectively, and breakage of the movable part 31 and the shaft parts 321, 322 may be suppressed more effectively. Further, the impacts at collisions are relaxed, and unnecessary vibrations of the vibration system generated due to the collisions may be suppressed more effectively.

Note that, when the movable part regulating members 36 and the shaft part regulating members 37 are formed using the resin material, for example, the members may be easily formed by slightly compressing and fitting the individual resin materials in the recessed portions 51, 52 and projecting part thereof from the opening portions 511, 521. In this case, the opening portions 511, 521 are slightly closed as described above, and thereby, the resin materials may be reliably kept within the recessed portions 51, 52 and separation of the resin materials from the recessed portions 51, 52 may be effectively prevented. Alternatively, they may be formed by reflow of the resin material. This method is the same as the above described method except that the material is changed from solder to resin, and the explanation will be omitted.

Second Embodiment

Next, the second embodiment of the image display device according to the invention will be explained.

Figure 11:
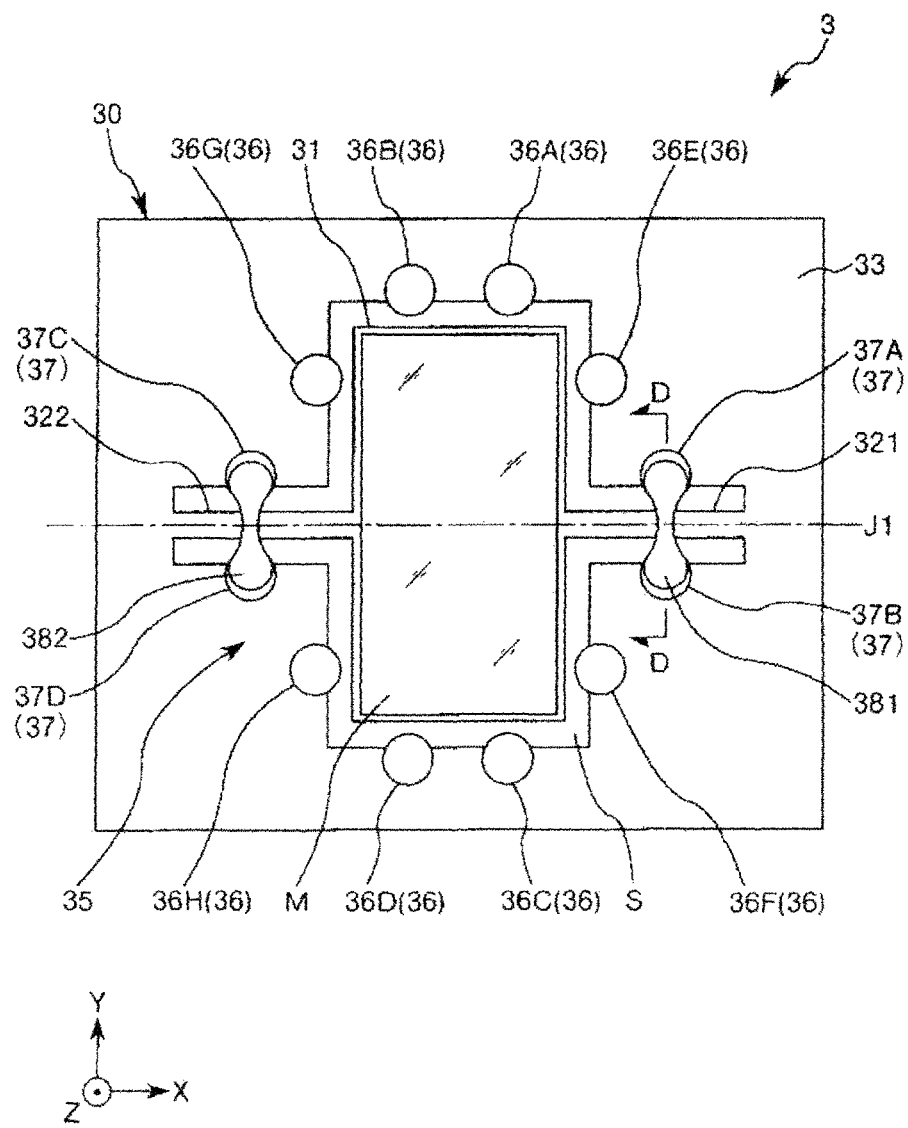
FIG. 11 is a plan view of an optical scanner of the second embodiment of the image display device according to the invention.
Figure 12:
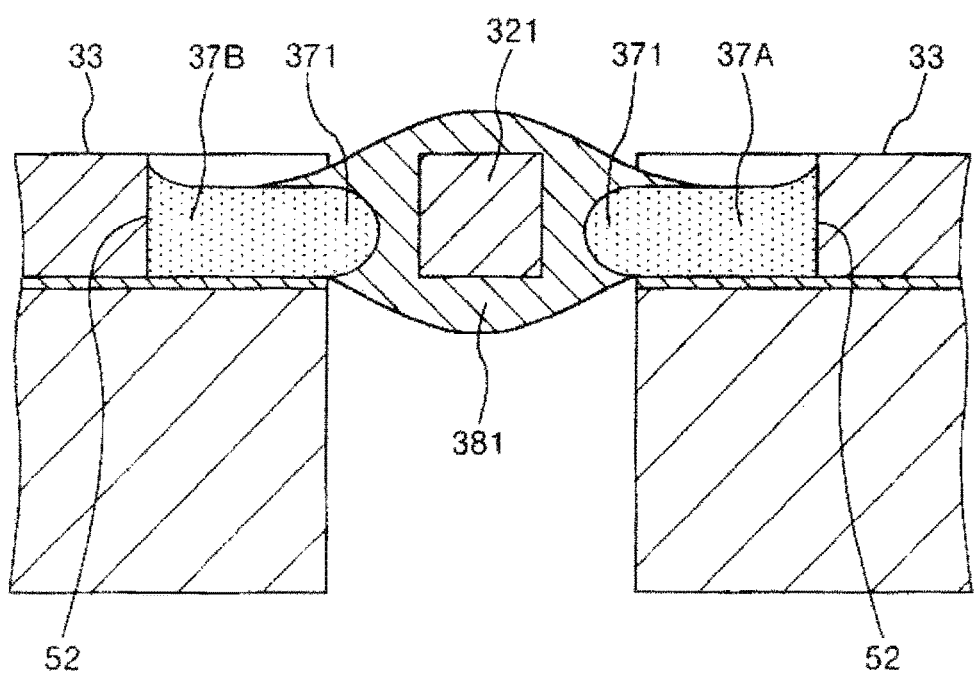
FIG. 12 is a sectional view along D-D line in FIG. 11.

FIG. 11 is a plan view of an optical scanner of the second embodiment of the image display device according to the invention. FIG. 12 is a sectional view along D-D line in FIG. 11.

As below, the image display device of the second embodiment will be explained with a focus on the differences from the above described embodiment and the explanation of the same items will be omitted.

The image display device of the second embodiment of the invention is the same as that of the above described first embodiment except that the configuration of the optical scanner is different. The same signs are assigned to the same configurations as those of the above described embodiment.

Optical Scanner

As shown in FIGS. 11 and 12, the optical scanner 3 of the embodiment further has a connecting portion 381 that connects the shaft part regulating members 37A, 37B and the shaft part 321 and a connecting portion 382 that connects the shaft part regulating members 37C, 37D and the shaft part 322. The connecting portion 381 is provided over the shaft part regulating members 37A, 37B and holds the shaft part 321 in the center part. Similarly, the connecting portion 382 is provided over the shaft part regulating members 37C, 37D and holds the shaft part 322 in the center part. The displacement of the shaft parts 321, 322 in the Z-axis directions is regulated by the connecting portions 381, 382, and thereby, impact resistance not only to the impacts within the XY in-plane directions but also to the impacts in the Z-axis directions may be improved.

The connecting portions 381, 382 are formed softer as long as the torsional deformation of the shaft parts 321, 322 may not substantially be inhibited. Specifically, the Young's moduli of the connecting portions 381, 382 are preferably equal to or less than one fiftieth and more preferably equal to or less than one hundredth of the Young's moduli of the shaft parts 321, 322. Thereby, the change of the vibration characteristics of the optical scanner 3 may be kept to be smaller (preferably, nearly zero). Accordingly, the optical scanner 3 that maintains the vibration characteristics and has the stronger resistance to the impacts in the Z-axis directions is obtained.

The constituent material of the connecting portions 381, 382 is not particularly limited, but various resin materials may be used. Further, of the resin materials, silicon resin is preferably used, and PDMS (dimetylpolysiloxane) is preferably used as the silicone resin. Thereby, the sufficiently soft connecting portions 381, 382 may be easily formed.

Note that, in the embodiment, the connecting portion 381 connects the shaft part regulating members 37A, 37B and the shaft part 321, however, it is only necessary that at least one of the shaft part regulating members 37A, 37B and the shaft part 321 are connected. The same applies to the connecting portion 382.

According to the second embodiment, the same effects as those of the above described first embodiment may be exerted.

Third Embodiment

Next, the third embodiment of the image display device according to the invention will be explained.

Figure 13A:
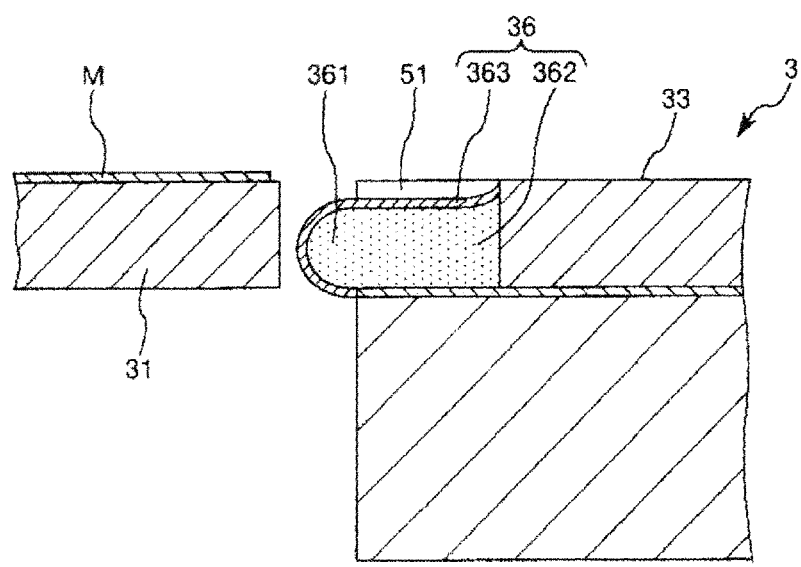
FIGS. 13A and 13B are sectional views of an optical scanner of the third embodiment of the image display device according to the invention.
Figure 13B:
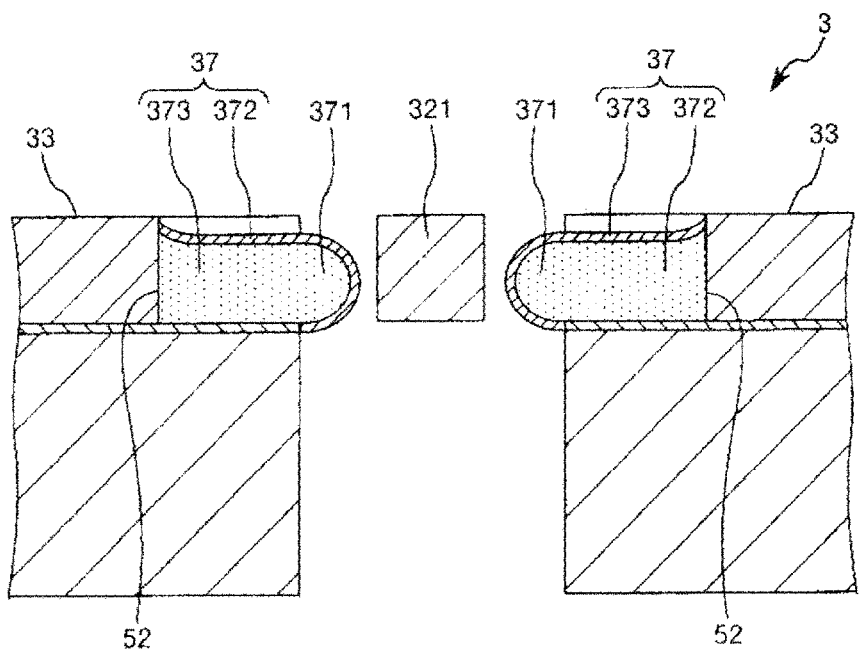

FIGS. 13A and 13B are sectional views of an optical scanner of the third embodiment of the image display device according to the invention.

As below, the image display device of the third embodiment will be explained with a focus on the differences from the above described embodiments and the explanation of the same items will be omitted.

The image display device of the third embodiment of the invention is the same as that of the above described first embodiment except that the configuration of the regulating member of the optical scanner is different. The same signs are assigned to the same configurations as those of the above described embodiments.

As shown in FIGS. 13A and 13B, in the optical scanner 3 of the embodiment, the movable part regulating member 36 includes a core part 362 and a resin layer 363 covering the core part 362, and the shaft part regulating member 37 includes a core part 372 and a resin layer 373 covering the core part 372. It is preferable that the core parts 362, 372 are harder (have higher Young's moduli) than the resin layers 363, 373. The core parts 362, 372 are not particularly limited, but e.g., various metal materials, specifically, the metal brazing material as described in the first embodiment may be used. Thereby, the core parts 362, 372 may be formed with the higher dimensional accuracy by the above described reflow. On the other hand, the resin layers 363, 373 are not particularly limited, but e.g., a resin material such as epoxy resin, phenol resin, silicone resin, or polyurethane resin may be used. Thereby, the sufficiently soft resin layers 363, 373 are obtained. The resin layers 363, 373 may be formed by coating of the surfaces of the core parts 362, 372 obtained by reflow with the resin.

As described above, the movable part regulating members 36 and the shaft part regulating members 37 are formed by composite materials of the core parts 362, 372 and the resin layers 363, 373, and thereby, the softer movable part regulating members 36 and the shaft part regulating members 37 with the higher dimensional accuracy may be obtained.

According to the third embodiment, the same effects as those of the above described first embodiment may be exerted.

Fourth Embodiment

Next, the fourth embodiment of the image display device according to the invention will be explained.

Figure 14:
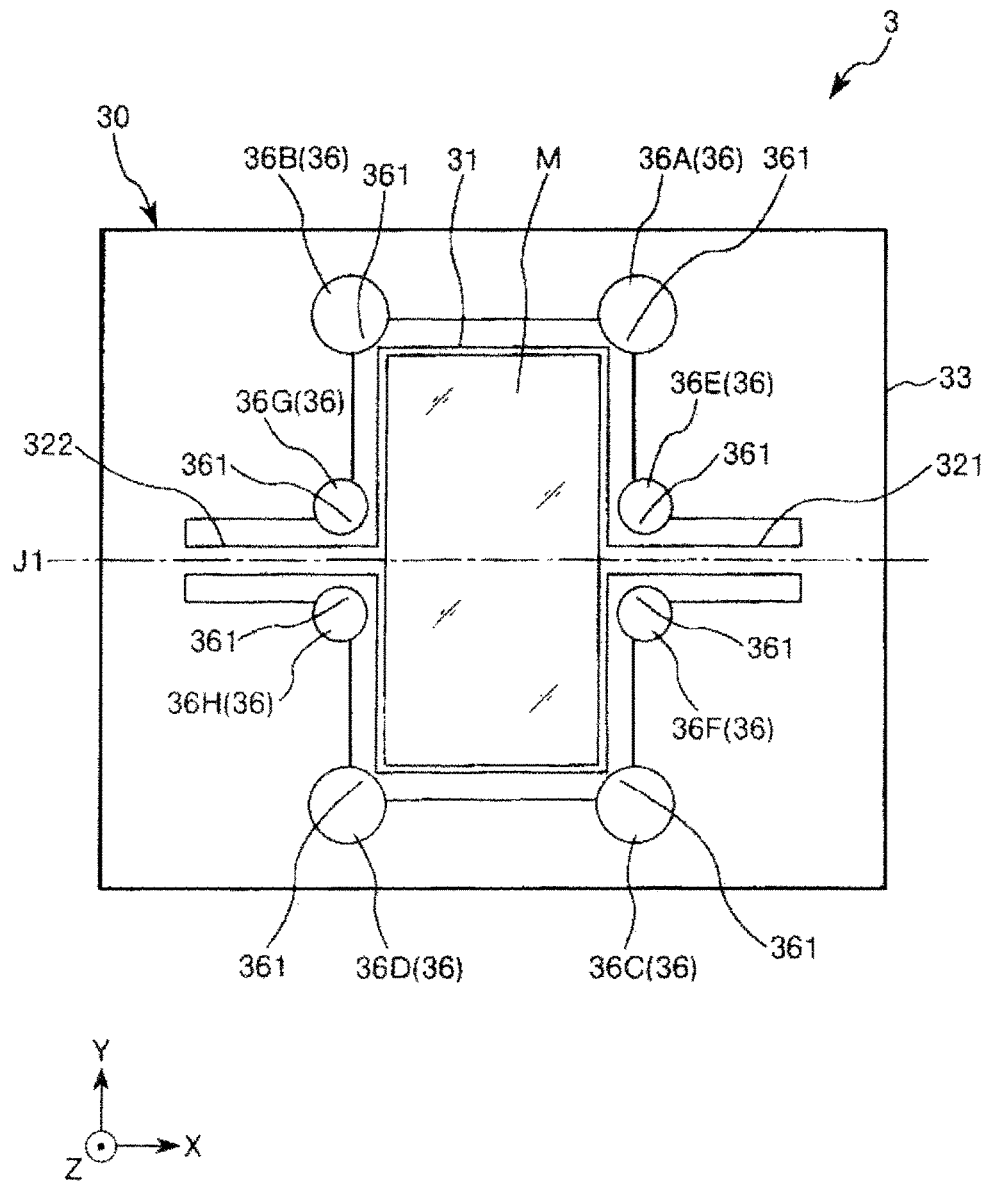
FIG. 14 is a plan view of an optical scanner of the fourth embodiment of the image display device according to the invention.

FIG. 14 is a plan view of an optical scanner of the fourth embodiment of the image display device according to the invention.

As below, the image display device of the fourth embodiment will be explained with a focus on the differences from the above described embodiments and the explanation of the same items will be omitted.

The image display device of the fourth embodiment of the invention is the same as that of the above described first embodiment except that the configuration of the regulating member of the optical scanner is different. The same signs are assigned to the same configurations as those of the above described embodiments.

As shown in FIG. 14, in the optical scanner 3 of the embodiment, the shaft part regulating members 37 are omitted. Further, the movable part regulating members 36A, 36B, 36C, 36D are respectively provided to be opposed to the four corners of the movable part 31. The projecting portions 361 of these movable part regulating members 36A to 36D are provided to respectively collide with the movable part 31 if the movable part 31 is displaced in any direction of the X-axis directions and the Y-axis directions with respect to the support part 33.

Further, the movable part regulating members 36E, 36F, 36G, 36H are respectively located in the boundary part between the inner side surface 331 and the inner side surface 332. The projecting portions 361 of these movable part regulating members 36E to 36H are respectively located between the support part 33 and the movable part 31 and located between the support part 33 and the shaft parts 321, 322. Accordingly, the movable part regulating members 36E to 36H respectively serve as the shaft part regulating members. As described above, the movable part regulating members 36E to 36H serve as the shaft part regulating members, and thereby, for example, the number of regulating members 35 may be made smaller than that of the above described first embodiment.

According to the fourth embodiment, the same effects as those of the above described first embodiment may be exerted.

Fifth Embodiment

Next, the fifth embodiment of the image display device according to the invention will be explained.

Figure 15:
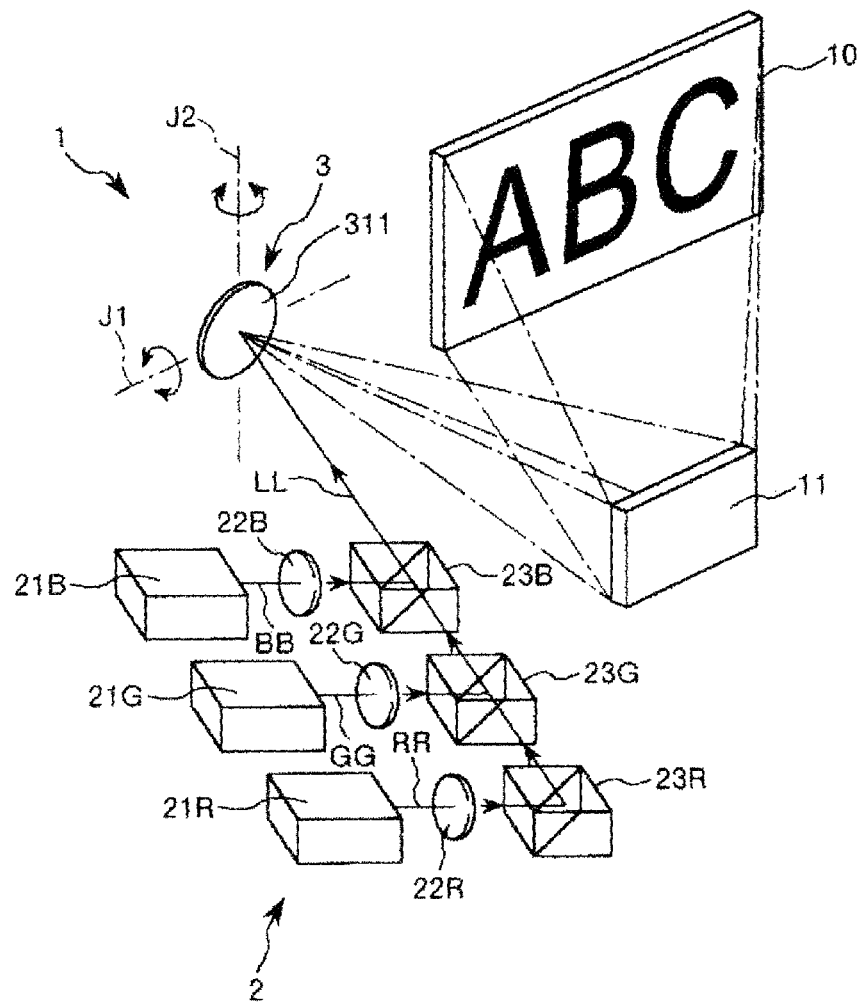
FIG. 15 is a configuration diagram showing the fifth embodiment of the image display device according to the invention.
Figure 16:
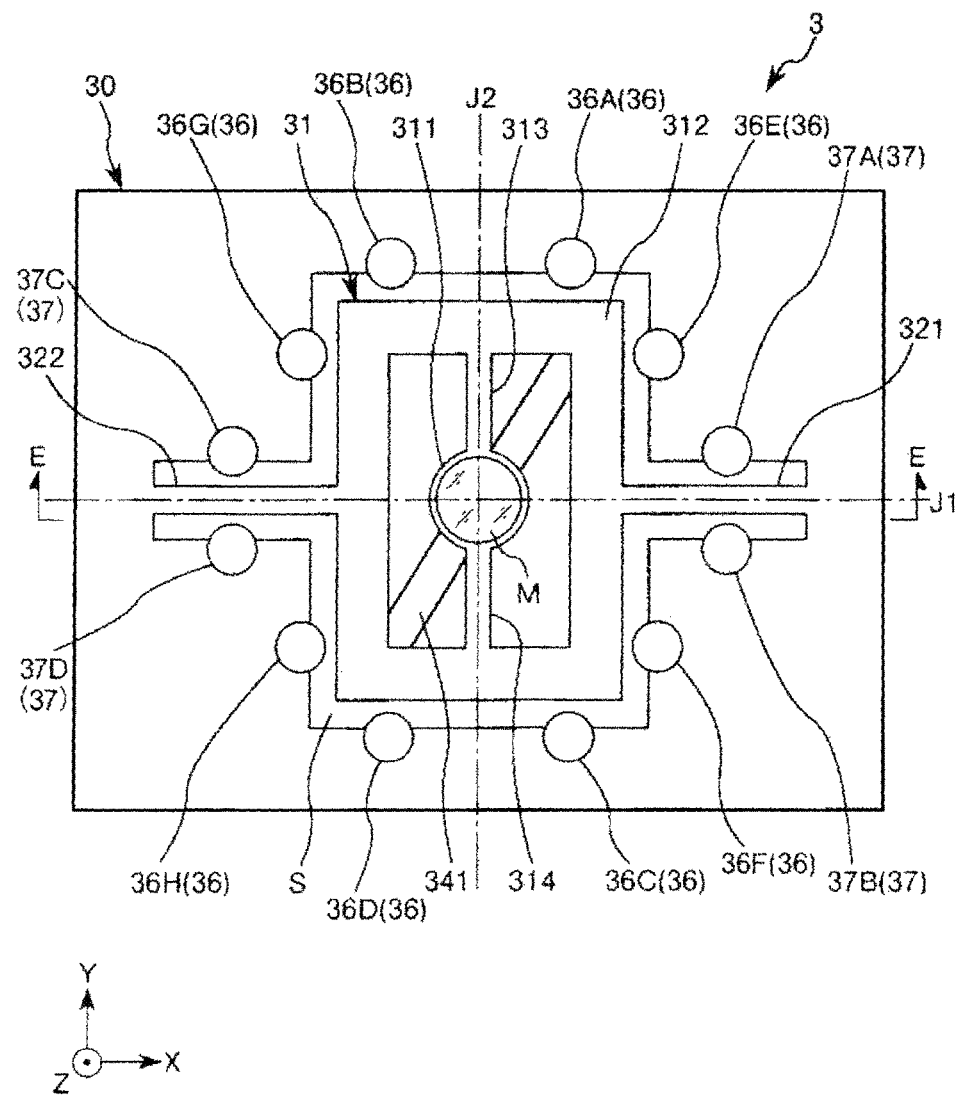
FIG. 16 is a top view of an optical scanner of the image display device shown in FIG. 15.
Figure 17:
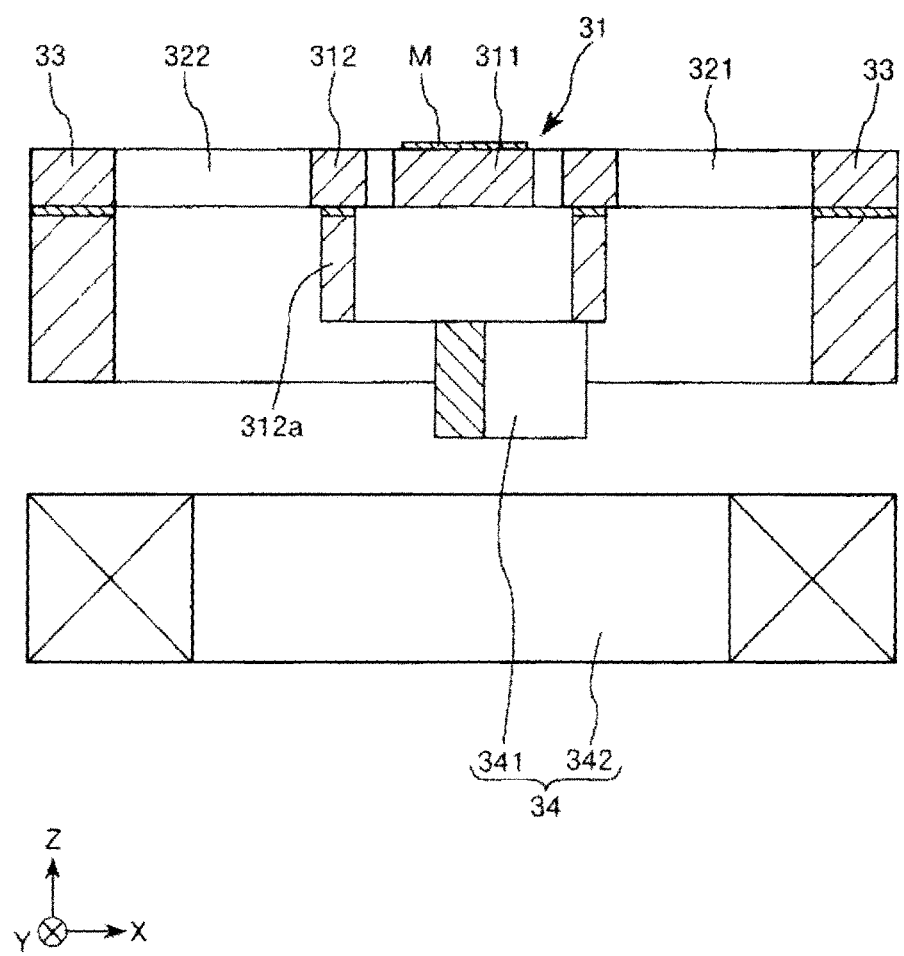
FIG. 17 is a sectional view along E-E line in FIG. 16.

FIG. 15 is a configuration diagram showing the fifth embodiment of the image display device according to the invention. FIG. 16 is a top view of an optical scanner of the image display device shown in FIG. 15. FIG. 17 is a sectional view along E-E line in FIG. 16.

As below, the image display device of the fifth embodiment will be explained with a focus on the differences from the above described embodiments and the explanation of the same items will be omitted.

The image display device of the fifth embodiment of the invention is the same as that of the above described first embodiment except that the number and the configuration of the optical scanner are different. The same signs are assigned to the same configurations as those of the above described embodiments.

As shown in FIG. 15, the image display device 1 of the embodiment has the drawing light source unit 2 that outputs the drawing laser light LL, the optical scanner 3 that scans with the drawing laser light LL, and a mirror 11 that reflects the drawing laser light LL used for scanning in the optical scanner 3. Note that the mirror 11 may be provided as appropriate and dispensable.

Drawing Light Source Unit

The drawing light source unit 2 has the same configuration as that of the above described first embodiment and the explanation will be omitted.

Optical Scanner

The optical scanner 3 has a function of two-dimensional scanning with the drawing laser light LL output from the drawing light source unit 2.

As shown in FIG. 16, the optical scanner 3 includes the structure 30 having the movable part 31 with the light reflection portion M, the support part 33, and the shaft parts 321, 322, the drive unit 34 for swinging the movable part 31, and the regulating member 35 that regulates excessive displacement of the movable part 31 and excessive deformation of the shaft parts 321, 322.

Further, the movable part 31 has a first movable part 311 with the light reflection portion M provided on the upper surface, a second movable part 312 in a frame shape provided to surround the first movable part 311, and a pair of shaft parts (second shaft parts) 313, 314 that connect the first movable part 311 and the second movable part 312 and swingably support the first movable part 311 around a second axis J2 orthogonal to the first axis J1. The pair of shaft parts 313, 314 are provided to be opposed to each other via the first movable part 311, and extend in the directions along the second axis J2.

Further, a plurality of the movable part regulating members 36 are provided around the second movable part 312. Specifically, the pair of movable part regulating members 36A, 36B opposed to the outer side surface at the +Y-axis side of the second movable part 312, the pair of movable part regulating members 36C, 36D opposed to the outer side surface at the −Y-axis side of the second movable part 312, the pair of movable part regulating members 36E, 36F opposed to the outer side surface at the +X-axis side of the second movable part 312, and the pair of movable part regulating members 36G, 36H opposed to the outer side surface at the −X-axis side of the second movable part 312 are provided. Further, the movable part regulating members 36A, 36B and the movable part regulating members 36C, 36D are respectively provided on the opposite sides to each other with respect to the second axis J2, and the movable part regulating members 36E, 36F and the movable part regulating members 36G, 36H are respectively provided on the opposite sides to each other with respect to the first axis J1. Note that the arrangement and number of the movable part regulating members 36 are not limited to those described above.

Similarly, a plurality of the shaft part regulating members 37 are provided around the shaft parts 321, 322. Specifically, the pair of shaft part regulating members 37A, 37B opposed in the Y-axis directions via the shaft part 321 and the pair of shaft part regulating members 37C, 37D opposed in the Y-axis directions via the shaft part 322 are provided. Note that the arrangement and number of the shaft part regulating members 37 are not limited to those described above.

Further, as shown in FIG. 17, a rib 312a is provided on the lower surface of the second movable part 312, and the permanent magnet 341 is provided on the lower surface of the rib 312a. The rib 312a has a function as a reinforcing portion that reinforces mechanical strength of the second movable part 312 and a function as a gap member that secures a space between the first movable part 311 and the permanent magnet for preventing the contact between them. The permanent magnet 341 has a rod shape with one end side as the S-pole and the other end side as the N-pole, and is provided to be tilted with respect to both axes of the first and second axes J1, J2 in the plan view.

In the optical scanner 3 having the above described configuration, the first movable part 311, the shaft parts 313, 314, the second movable part 312, the shaft parts 321, 322, and the permanent magnet 341 form a first vibration system that swings the first movable part 311 about the first axis J1. Further, the first movable part 311 and the shaft parts 313, 314 form a second vibration system that swings the first movable part 311 about the second axis J2.

Furthermore, the first movable part 311 is swung about the second axis J2 with respect to the second movable part 312 and the second movable part 312 is swung about the first axis J1 with respect to the support part 33, and thereby, the first movable part 311 may be swung about the two axes of the first and second axes J1, J2. Note that, in the embodiment, the optical scanner 3 is provided so that vertical scan (sub-scan) with the drawing laser light LL may be performed by the swing of the first movable part 311 about the first axis J1 and the horizontal scan (main scan) with the drawing laser light LL may be performed by the swing of the first movable part 311 about the second axis J2.

The coil 342 is provided under the permanent magnet 341, a superimposed voltage formed by superimposition of a first alternating voltage for swinging the first vibration system and a second alternating voltage for swinging the second vibration system is applied to the coil 342, and thereby, the first movable part 311 may be swung around the two axes of the first and second axes J1, J2. The first alternating voltage is not particularly limited, but may be the same as e.g., the alternating voltage applied to the optical scanner 3″ for vertical scanning of the above described first embodiment. Further, the second alternating voltage is not particularly limited, but may be the same as e.g., the alternating voltage applied to the optical scanner 3′ for horizontal scanning of the above described first embodiment. In this case, it is preferable that the first vibration system is non-resonant-driven and the second vibration system is resonant-driven.

As above, the optical scanner 3 of the embodiment is explained in detail. According to the two-dimensional scanning-type optical scanner 3 having a gimbal shape as in the embodiment, two-dimensional scanning with the drawing laser light LL may be performed by one device, and, for example, compared to the configuration for two-dimensional scanning with the drawing laser light LL by combining two one-dimensional scanning-type optical scanners as in the above described first embodiment, the device may be downsized and the adjustment of alignment may be easier.

According to the fifth embodiment, the same effects as those of the above described first embodiment may be exerted.

Note that, in the embodiment, for example, the regulating member 35 may be provided in the second movable part 312 like the support part 33. In this case, the regulating member 35 may be provided so that part thereof may project from the inner side surface of the second movable part 312 and the projecting portion may be located between the second movable part 312 and the shaft parts 313, 314. Thereby, excessive displacement of the first movable part 311 with respect to the second movable part 312 is suppressed, and breakage of the shaft parts 313, 314 may be effectively suppressed.

Sixth Embodiment

Next, the sixth embodiment of the image display device according to the invention will be explained.

Figure 18:
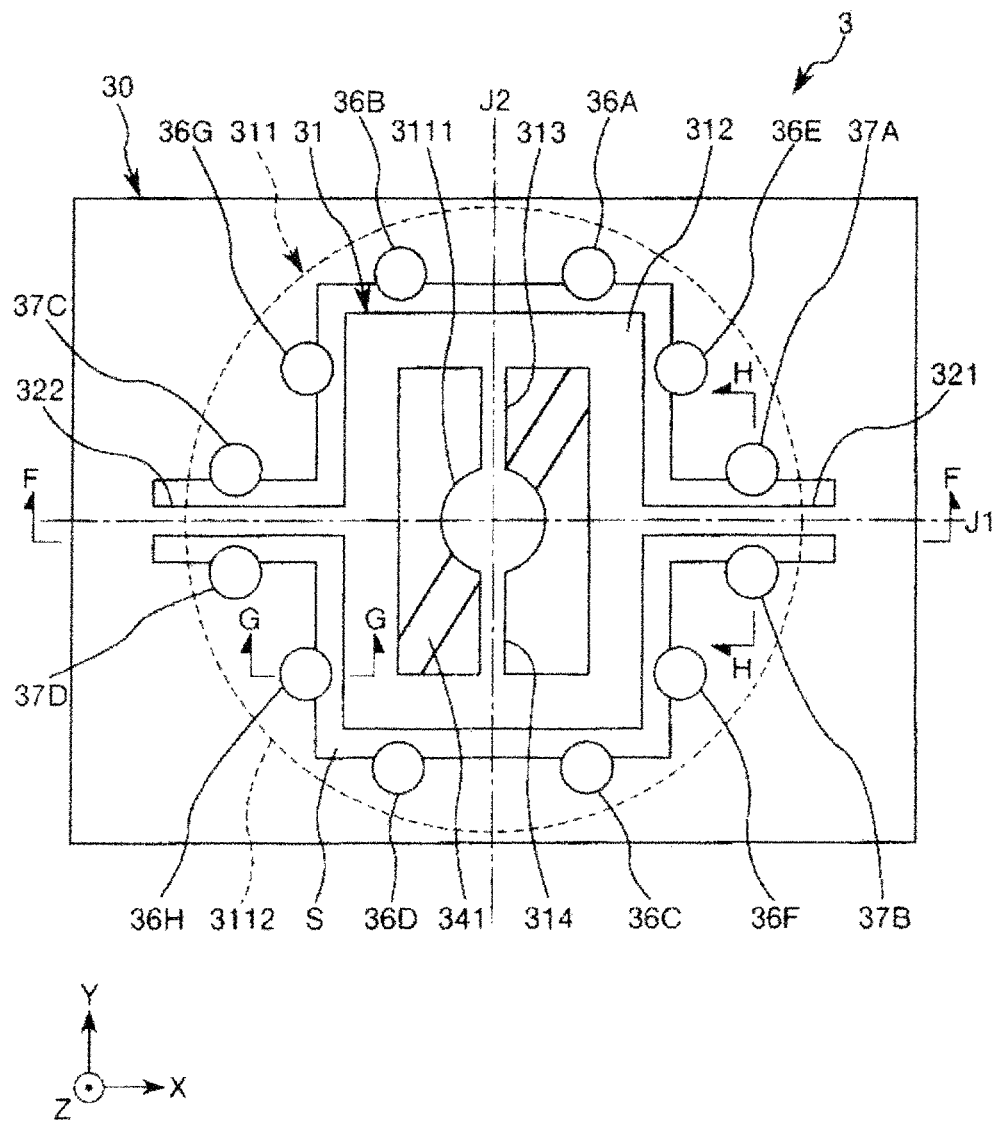
FIG. 18 is a top view of an optical scanner of the image display device according to the sixth embodiment of the invention.
Figure 19:
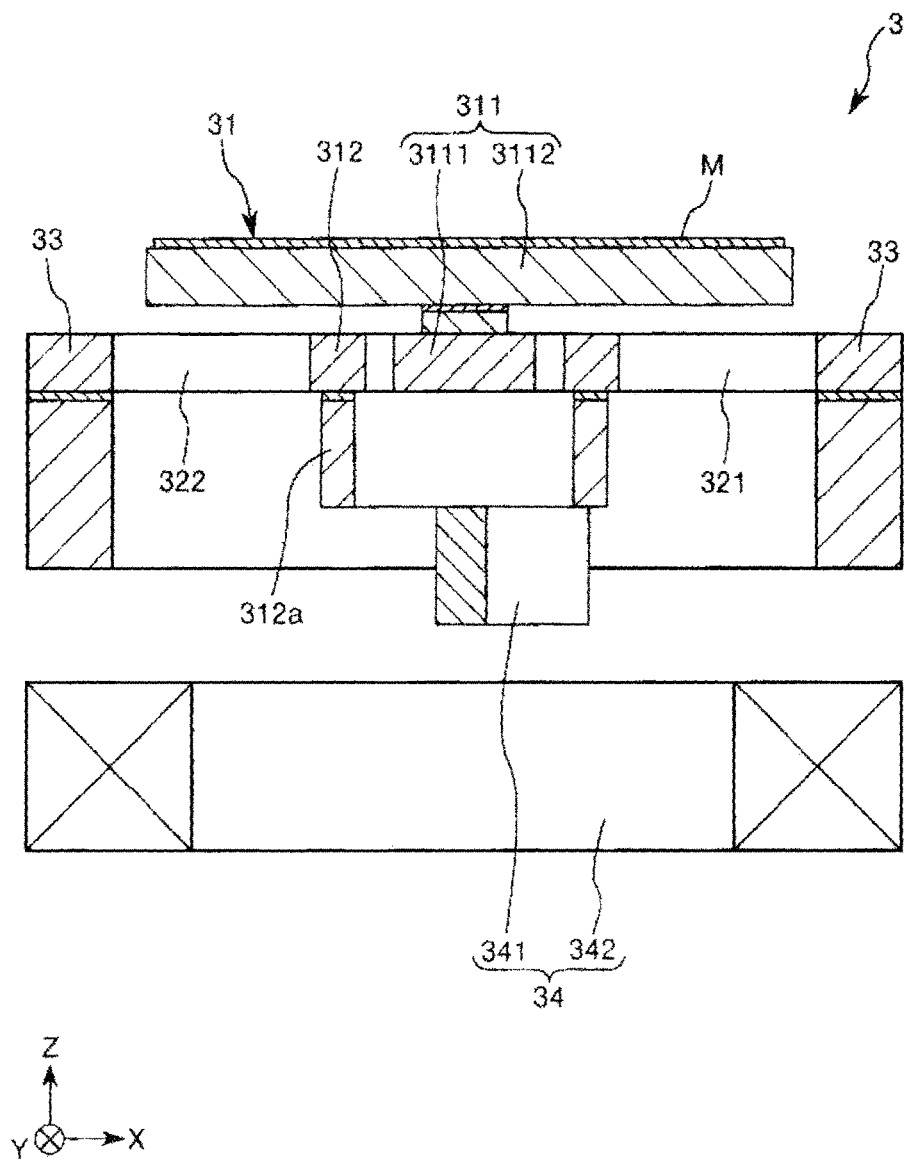
FIG. 19 is a sectional view along F-F line in FIG. 18.
Figure 20:
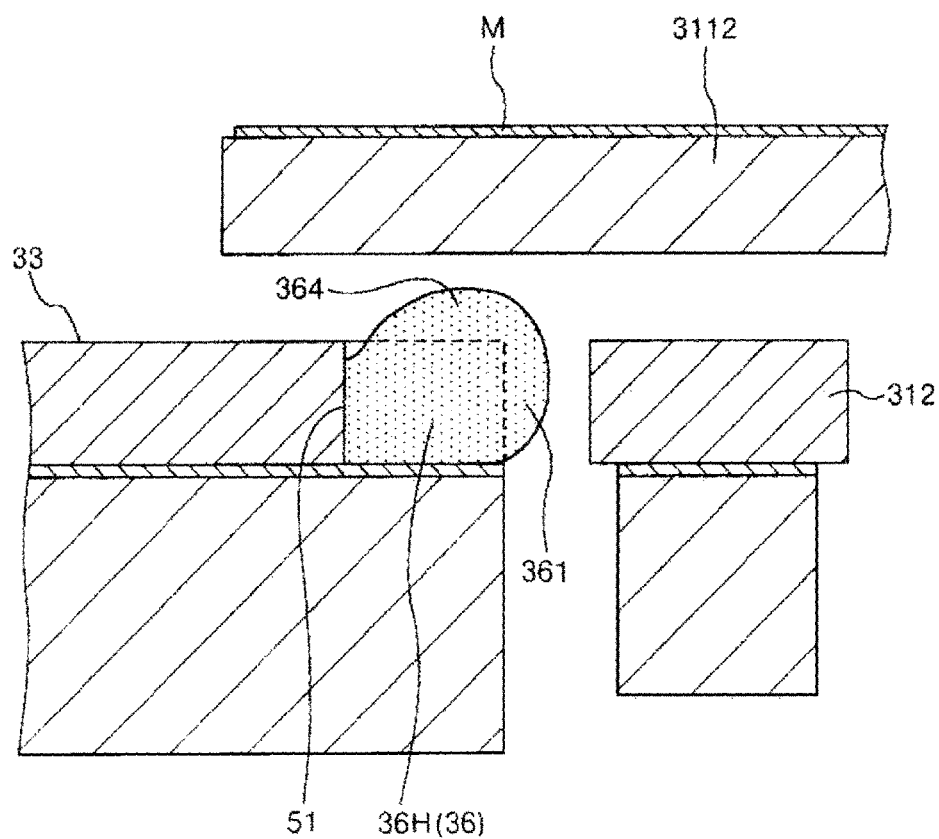
FIG. 20 is a sectional view along G-G line in FIG. 18.
Figure 21:
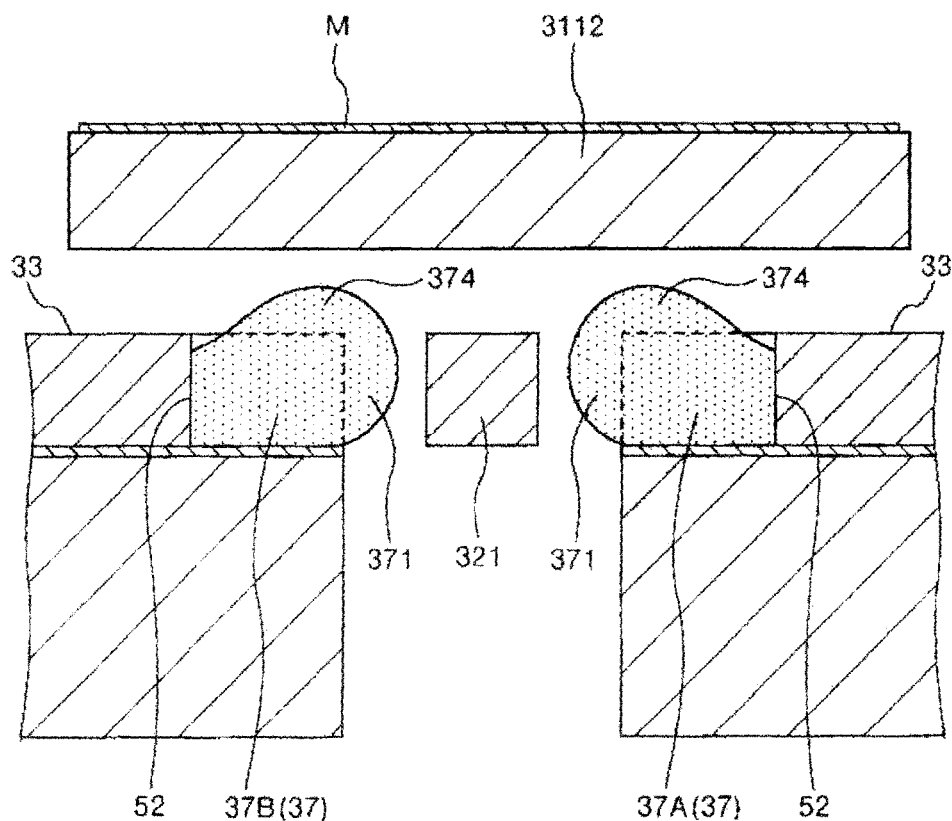
FIG. 21 is a sectional view along H-H line in FIG. 18.

FIG. 18 is a top view of an optical scanner of the image display device according to the sixth embodiment of the invention. FIG. 19 is a sectional view along F-F line in FIG. 18. FIG. 20 is a sectional view along G-G line in FIG. 18. FIG. 21 is a sectional view along H-H line in FIG. 18.

As below, the image display device of the sixth embodiment will be explained with a focus on the differences from the above described embodiments and the explanation of the same items will be omitted.

The image display device of the sixth embodiment of the invention is the same as that of the above described fifth embodiment except that the configuration of the optical scanner is different. The same signs are assigned to the same configurations as those of the above described embodiments.

As shown in FIGS. 18 and 19, in the optical scanner 3 of the embodiment, the first movable part 311 has a base portion 3111 and a hold portion 3112 provided on the upper surface of the base portion 3111, and the light reflection portion M is provided on the upper surface of the hold portion 3112.

Further, the hold portion 3112 is provided to separate from the shaft parts 313, 314 in the Z-axis direction and overlap with the base portion 3111 and the parts 313, 314 in the plan view. Accordingly, the area of the upper surface of the hold portion 3112 (i.e., the area of the light reflection portion M) may be increased while the distance between the parts 313, 314 is made shorter. Further, the distance between the parts 313, 314 may be made shorter, and thereby, the second movable part 312 may be downsized.

Furthermore, in the plan view, the movable part regulating members 36 (36A to 36H) and the shaft part regulating members 37 (37A to 37D) are respectively located to overlap with the hold portion 3112. As shown in FIG. 20, the movable part regulating member 36 has a projecting portion 364 projecting upward from the opening of the recessed portion 51 (the upper surface of the support part 33) and similarly, as shown in FIG. 21, the shaft part regulating member 37 has a projecting portion 374 projecting upward from the opening of the recessed portion 52 (the upper surface of the support part 33). That is, the projecting portions 364, 374 are respectively located between the support part 33 and the hold portion 3112.

The movable part regulating members 36 and the shaft part regulating members 37 have the above described configurations and arrangements, and thereby, impact resistance not only to the impacts within the XY in-plane directions but also to the impacts in the Z-axis directions may be improved. For example, when excessive acceleration is applied in the +Z-direction, the movable part 31 is displaced in the −Z-direction and the hold portion 3112 collides with the projecting portions 364, 374. Thereby, more displacement of the movable part 31 is regulated and breakage of the shaft parts 321, 322 is suppressed. Therefore, impact resistance is improved to the impacts in the Z-axis directions.

According to the sixth embodiment, the same effects as those of the above described first embodiment may be exerted.

Note that, in the embodiment, all of the movable part regulating members 36 (36A to 36H) and the shaft part regulating members 37 (37A to 37D) have the projecting portions 364, 374, however, not limited to those. It is only necessary that at least one of the movable part regulating members 36 (36A to 36H) and the shaft part regulating members 37 (37A to 37D) has the projecting portion 364 (374).

2. Head-Up Display

Next, a head-up display as an example of the image display device according to the invention will be explained.

Figure 22:
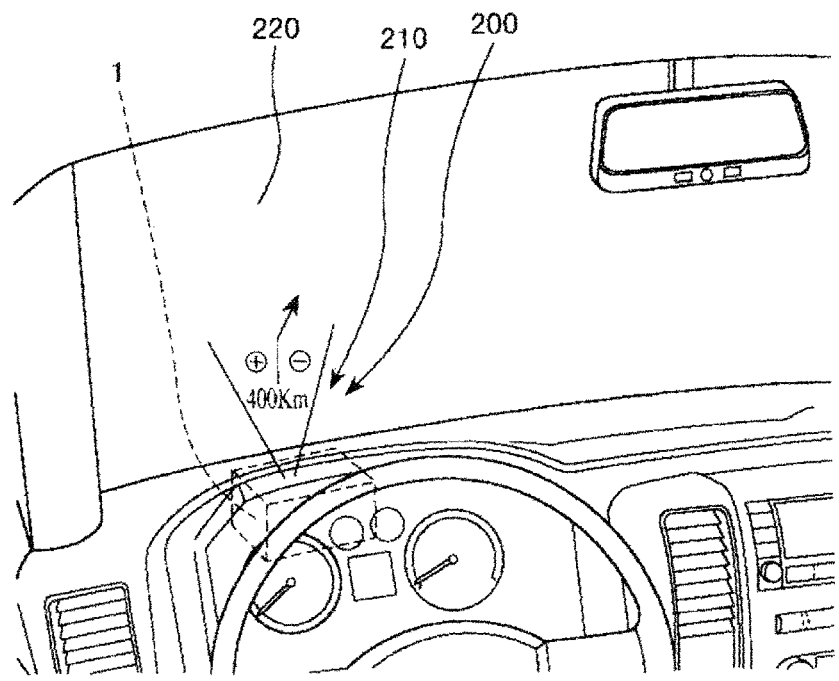
FIG. 22 is a perspective view showing a head-up display to which the image display device according to the invention is applied.

FIG. 22 is a perspective view showing the head-up display to which the image display device according to the invention is applied.

As shown in FIG. 22, in a head-up display system 200, the image display device 1 is mounted on a dashboard of an automobile to form a head-up display 210. By the head-up display 210, for example, a predetermined image for guide display to a destination or the like may be displayed on a windshield 220. Note that the head-up display system 200 may be applied not only to automobiles but also to airplanes, ships, etc.

3. Head Mounted Display

Next, a head mounted display according to the invention will be explained.

Figure 23:
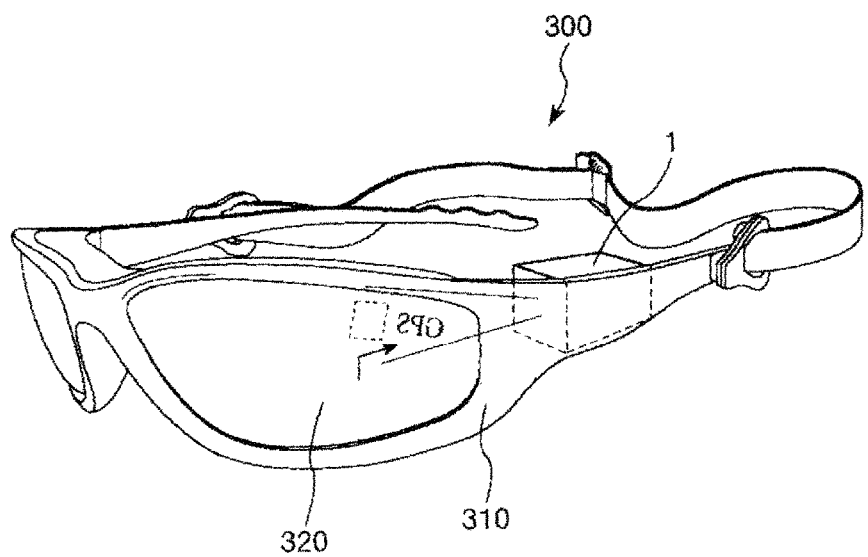
FIG. 23 is a perspective view showing a head mounted display according to the invention.

FIG. 23 is a perspective view showing the head mounted display according to the invention.

As shown in FIG. 23, a head mounted display 300 has a frame 310 attached to the head of an observer, and the image display device 1 mounted on the frame 310. Further, by the image display device 1, a predetermined image to be visually recognized by one eye is displayed on a display part (light reflection layer material) 320 provided in a part of the frame 310 originally as a lens.

The display part 320 may be transparent or opaque. When the display part 320 is transparent, information from the image display device 1 may be superimposed on information from the real world for use. Further, as long as the display part 320 reflects at least part of incident light, e.g., a half mirror or the like may be used therefor.

Note that two image display devices 1 are provided in the head mounted display 300, and images to be visually recognized by both eyes are displayed on two display parts.

As above, the optical scanner, image display device, head mounted display according to the invention are explained according to the illustrated embodiments, however, the invention is not limited to those. The configurations of the respective parts may be replaced by optional configurations having the same functions. Further, other optional configurations may be added to the invention.

The entire disclosure of Japanese Patent Application No. 2014-062779, filed Mar. 25, 2014 is expressly incorporated by reference herein.

What is claimed is:

1. An optical scanner comprising:
   a movable part including a light reflection portion that reflects light;
   a first shaft that swingably supports the movable part about a first axis;
   a support part that supports the first shaft and has an inner wall facing the movable part;
   a recess provided in the support part, and having an opening in the inner wall of the support part; and
   a regulating member provided in the recess of the support part, separately from the support part and spaced from the first shaft, and projecting beyond the inner wall of the support part and toward the movable part.

2. The optical scanner according to claim 1, wherein the regulating member comes into contact with the movable part to regulate displacement of the movable part when an impact is applied to the optical scanner.

3. An image display device comprising the optical scanner according to claim 2.

4. A head mounted display comprising:
   the optical scanner according to claim 2; and
   a frame attached to a head of an observer with the optical scanner mounted thereon.

5. The optical scanner according to claim 1, wherein a Young's modulus of the regulating member is equal to or less than one fiftieth of a Young's modulus of the movable part or the first shaft.

6. The optical scanner according to claim 1, wherein the regulating member is formed using a metal brazing material.

7. The optical scanner according to claim 1, wherein the regulating member is formed using a resin.

8. The optical scanner according to claim 1, wherein the regulating member has a core part and a resin layer covering the core part.

9. The optical scanner according to claim 1, wherein the recess has a circular shape with a loss in a location of the opening in the inner wall in a plan view.

10. The optical scanner according to claim 1, wherein the movable part has a first movable part, a second movable part in a frame shape provided to surround the first movable part, and a second shaft that connects the first movable part and the second movable part and swingably supports the first movable part about a second axis intersecting with the first axis with respect to the second movable part.

11. The optical scanner according to claim 10, wherein the first movable part has a base portion swingably supported by the second shaft and a hold portion fixed to the base portion and located on the one surface side, and provided to cover the base part in a plan view, and the light reflection portion is provided in the hold portion.

12. The optical scanner according to claim 11, wherein the hold portion overlaps with the regulating member in the plan view and the regulating member projects from the opening portion to the hold portion side.

13. An image display device comprising the optical scanner according to claim 1.

14. A head mounted display comprising:
the optical scanner according to claim 1; and
a frame attached to a head of an observer with the optical scanner mounted thereon.

15. An optical scanner comprising:
a movable part including a light reflection portion that reflects light;
a first shaft that swingably supports the movable part about a first axis;
a support part that supports the first shaft and has an inner wall facing the movable part;
a recess provided in the support part and having an opening in the inner wall of the support part; and
a regulating member provided in the recess and spaced from the first shaft, the regulating member projecting beyond the inner wall of the support part and toward the first shaft.

16. The optical scanner according to claim 15, wherein the regulating member comes into contact with the first shaft to regulate displacement of the first shaft when an impact is applied to the optical scanner.

17. The optical scanner according to claim 15, further comprising a connecting portion that connects the regulating member and the first shaft,
wherein a Young's modulus of the connecting portion is equal to or less than one fiftieth of a Young's modulus of the first shaft.

18. The optical scanner according to claim 17, wherein the connecting portion is formed using silicone resin.

19. An image display device comprising the optical scanner according to claim 15.

20. A head mounted display comprising:
the optical scanner according to claim 15; and
a frame attached to a head of an observer with the optical scanner mounted thereon.

* * * * *